United States Patent
Ozasa et al.

(10) Patent No.: US 11,984,867 B2
(45) Date of Patent: May 14, 2024

(54) LONGITUDINALLY COUPLED RESONATOR ACOUSTIC WAVE FILTER AND FILTER DEVICE

(71) Applicant: Murata Manufacturing Co., Ltd., Nagaokakyo (JP)

(72) Inventors: Motoki Ozasa, Nagaokakyo (JP); Chihiro Shoda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 374 days.

(21) Appl. No.: 17/487,343

(22) Filed: Sep. 28, 2021

(65) Prior Publication Data

US 2022/0014171 A1    Jan. 13, 2022

Related U.S. Application Data

(63) Continuation of application No. PCT/JP2020/008449, filed on Feb. 28, 2020.

(30) Foreign Application Priority Data

Mar. 29, 2019    (JP) .................................. 2019-067436

(51) Int. Cl.
*H03H 9/02*    (2006.01)
*H03H 9/54*    (2006.01)

(52) U.S. Cl.
CPC .... *H03H 9/02228* (2013.01); *H03H 9/02015* (2013.01); *H03H 9/0211* (2013.01); *H03H 9/54* (2013.01)

(58) Field of Classification Search
CPC ........... H03H 9/02228; H03H 9/02015; H03H 9/0211; H03H 9/54; H03H 9/02692;
(Continued)

(56) References Cited

U.S. PATENT DOCUMENTS

| | | | |
|---|---|---|---|
| 2009/0224854 A1 | 9/2009 | Ohkubo et al. | |
| 2010/0237963 A1* | 9/2010 | Takamine | H03H 9/14573 310/313 C |

(Continued)

FOREIGN PATENT DOCUMENTS

| | | |
|---|---|---|
| JP | 2009-218812 A | 9/2009 |
| WO | 2015/182522 A1 | 12/2015 |
| WO | 2015/198904 A1 | 12/2015 |

OTHER PUBLICATIONS

Official Communication issued in International Patent Application No. PCT/JP2020/008449, dated Apr. 28, 2020.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A longitudinally coupled resonator acoustic wave filter includes a piezoelectric substrate, IDT electrodes on the piezoelectric substrate along an acoustic wave propagation direction, and a pair of reflectors on the piezoelectric substrate on both sides of the IDT electrodes in the acoustic wave propagation direction. Each of the reflectors includes first and second reflector busbars, and first reflective electrode fingers connected to at least one of the first reflector busbar and the second reflector busbar. The reflector includes a first portion in which lengths of the first reflective electrode fingers change in the acoustic wave propagation direction.

19 Claims, 13 Drawing Sheets

(58) Field of Classification Search
CPC ............. H03H 9/1457; H03H 9/02992; H03H 9/02574; H03H 9/14573; H03H 9/02716
USPC ................................................ 333/193–196
See application file for complete search history.

(56) References Cited

U.S. PATENT DOCUMENTS

2017/0047905 A1    2/2017   Araki et al.
2017/0093371 A1    3/2017   Takamine

* cited by examiner

LONGITUDINALLY COUPLED RESONATOR ACOUSTIC WAVE FILTER AND FILTER DEVICE

CROSS REFERENCE TO RELATED APPLICATIONS

This application claims the benefit of priority to Japanese Patent Application No. 2019-067436 filed on Mar. 29, 2019 and is a Continuation Application of PCT Application No. PCT/JP2020/008449 filed on Feb. 28, 2020. The entire contents of each application are hereby incorporated herein by reference.

BACKGROUND OF THE INVENTION

1. Field of the Invention

The present invention relates to a longitudinally coupled resonator acoustic wave filter and a filter device.

2. Description of the Related Art

A longitudinally coupled resonator acoustic wave filter has been widely used for a filter, such as a filter in a cellular phone. International Publication No. 2015/198904 discloses an example of a longitudinally coupled resonator acoustic wave filter. In the longitudinally coupled resonator acoustic wave filter, a high acoustic velocity member, a low acoustic velocity film, and a piezoelectric film are laminated in this order. A plurality of interdigital transducer (IDT) electrodes and reflectors are provided on the piezoelectric film. Providing the layered structure above increases a Q factor.

Patterning of the IDT electrodes in the longitudinally coupled resonator acoustic wave filter practically poses an issue of variations in a width of electrode fingers. Accordingly, variations in attenuation are induced particularly in a frequency range near a lower side of a pass band. This may cause the deterioration of attenuation characteristics in the frequency range above. Further, in the longitudinally coupled resonator acoustic wave filter having the layered structure described above, the variations in the width of the electrode fingers are particularly large because of the influence of, for example, planarity of the piezoelectric film. Thus, although the Q factor may be increased, it is difficult to control the attenuation since the variation in attenuation further increases in a frequency range near the lower side of the pass band.

SUMMARY OF THE INVENTION

Preferred embodiments of the present invention provide longitudinally coupled resonator acoustic wave filters and filter devices that are each able to reduce or prevent the variations in attenuation in a frequency range near the lower side of the pass band.

A longitudinally coupled resonator acoustic wave filter according to a preferred embodiment of the present invention includes a piezoelectric substrate, a plurality of IDT electrodes on the piezoelectric substrate and extending along an acoustic wave propagation direction, and a pair of reflectors on the piezoelectric substrate on both sides of the plurality of IDT electrodes in the acoustic wave propagation direction. Each of the reflectors includes a first reflector busbar and a second reflector busbar facing each other, and a plurality of reflective electrode fingers connected to at least one of the first reflector busbar and the second reflector busbar. Each of the reflectors includes a first portion in which lengths of the plurality of reflective electrode fingers change in the acoustic wave propagation direction.

A filter device according to a preferred embodiment of the present invention includes a longitudinally coupled resonator acoustic wave filter according to a preferred embodiment of the present invention and at least one resonator other than the longitudinally coupled resonator acoustic wave filter.

According to the longitudinally coupled resonator acoustic wave filters and the filter devices according to preferred embodiments of the present invention, the Q factor is able to be increased and the variations in attenuation are able to be reduced or prevented in a frequency range near the lower side of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

The preferred embodiments described in the present description are exemplary, and partial replacement or combination of components between different preferred embodiments is possible.

Figure 1:
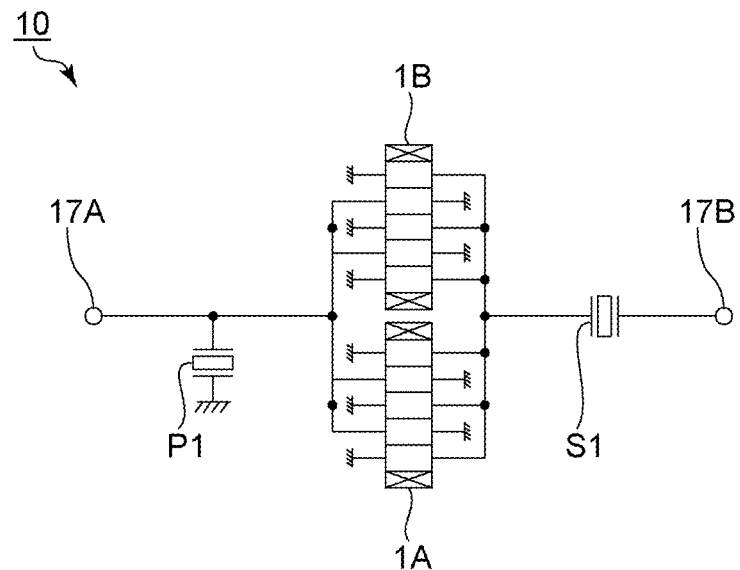
FIG. 1 is a circuit diagram of a filter device according to a first preferred embodiment of the present invention.

FIG. 1 is a circuit diagram of a filter device according to a first preferred embodiment of the present invention. FIG. 1 schematically illustrates a portion of a reflector, which will be described later, with two diagonal lines being added to a rectangle.

A filter device 10 includes a first signal terminal 17A and a second signal terminal 17B. The filter device 10 includes a first longitudinally coupled resonator acoustic wave filter 1A and a second longitudinally coupled resonator acoustic wave filter 1B connected in parallel to each other between the first signal terminal 17A and the second signal terminal 17B. Both of the first longitudinally coupled resonator acoustic wave filter 1A and the second longitudinally coupled resonator acoustic wave filter 1B are a longitudinally coupled resonator acoustic wave filter according to a preferred embodiment of the present invention.

The filter device 10 includes a first acoustic wave resonator P1 connected between a ground potential and a node between the first signal terminal 17A and the first longitudinally coupled resonator acoustic wave filter 1A and second longitudinally coupled resonator acoustic wave filter 1B. Further, the filter device 10 includes a second acoustic wave resonator S1 connected between the second signal terminal 17B and the first longitudinally coupled resonator acoustic wave filter 1A and second longitudinally coupled resonator acoustic wave filter 1B. The circuit configuration of the filter device 10 is not limited to the configuration above, and it is sufficient that the filter device 10 includes at least one longitudinally coupled resonator acoustic wave filter according to a preferred embodiment of the present invention and a resonator other than the longitudinally coupled resonator acoustic wave filter.

The filter device 10 of the present preferred embodiment is, for example, a band pass filter of which pass band is a reception band of Band3, and is about 1805 MHz to about 1880 MHz. Note that the pass band of the filter device 10 is not limited to the above. Alternatively, the filter device according to a preferred embodiment of the present invention may be a duplexer or a multiplexer.

Figure 2:
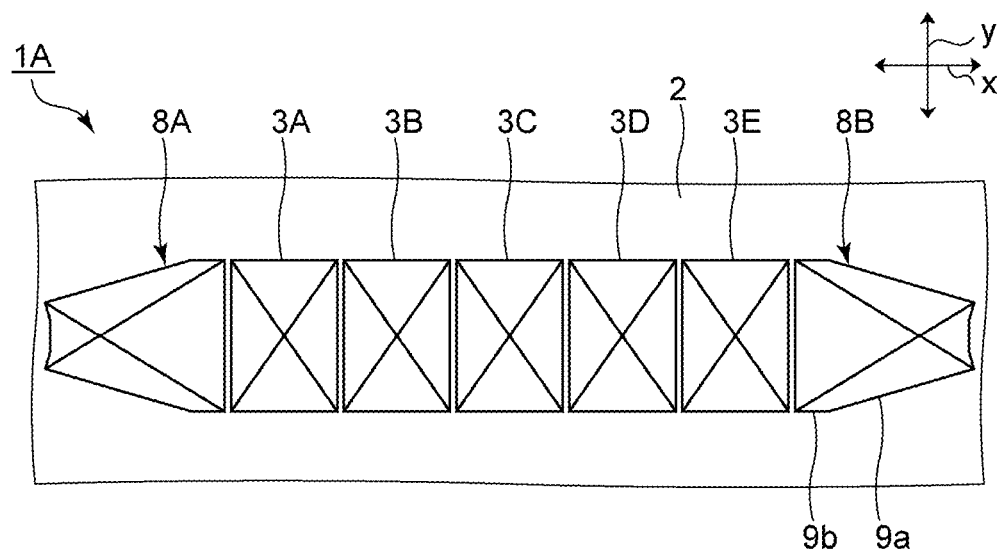
FIG. 2 is a schematic plan view illustrating a vicinity of a first longitudinally coupled resonator acoustic wave filter of the filter device according to the first preferred embodiment of the present invention.

FIG. 2 is a schematic plan view of the filter device according to the first preferred embodiment illustrating the vicinity of the first longitudinally coupled resonator acoustic wave filter. In FIG. 2, an IDT electrode and a reflector, which will be described later, are schematically illustrated with two diagonal lines being added to a polygon. Wires connected to the first longitudinally coupled resonator acoustic wave filter 1A are omitted in FIG. 2.

The first longitudinally coupled resonator acoustic wave filter 1A includes a piezoelectric substrate 2, and an IDT electrode 3A, an IDT electrode 3B, an IDT electrode 3C, an IDT electrode 3D, and an IDT electrode 3E provided on the piezoelectric substrate 2. An acoustic wave is excited by applying an AC voltage to the IDT electrodes. In the present description, an acoustic wave propagation direction is defined as a first direction x, and a direction orthogonal or substantially orthogonal to the first direction x is defined as a second direction y.

The IDT electrode 3A, the IDT electrode 3B, the IDT electrode 3C, the IDT electrode 3D, and the IDT electrode 3E are arranged in this order along the first direction x. On the piezoelectric substrate 2, a pair of a reflector 8A and a reflector 8B are provided on both sides of the plurality of IDT electrodes above in the first direction x. More specifically, the reflector 8A is adjacent to the IDT electrode 3A, and the reflector 8B is adjacent to the IDT electrode 3E. As described above, the first longitudinally coupled resonator acoustic wave filter 1A is, for example, a 5-IDT longitudinally coupled resonator acoustic wave filter. Note that the first longitudinally coupled resonator acoustic wave filter 1A is not limited to the 5-IDT longitudinally coupled resonator acoustic wave filter, and may be a 3-IDT longitudinally coupled resonator acoustic wave filter or a 7-IDT longitudinally coupled resonator acoustic wave filter, for example.

Figure 3:
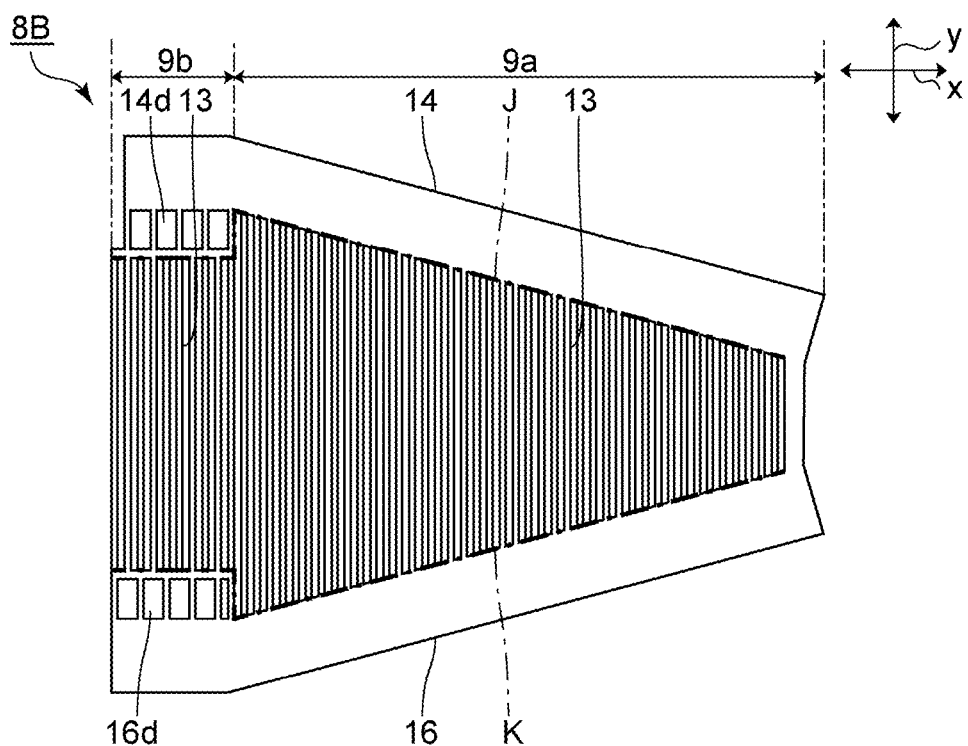
FIG. 3 is a plan view of a reflector in the first longitudinally coupled resonator acoustic wave filter according to the first preferred embodiment of the present invention.

FIG. 3 is a plan view of the reflector in the first longitudinally coupled resonator acoustic wave filter according to the first preferred embodiment.

The reflector 8B includes a first reflector busbar 14 and a second reflector busbar 16 facing each other, and a plurality of reflective electrode fingers. More specifically, the plurality of reflective electrode fingers of the present preferred embodiment are a plurality of first reflective electrode fingers 13 which are connected to both of the first reflector busbar 14 and the second reflector busbar 16. Each one end portion of the plurality of first reflective electrode fingers 13 is connected to the first reflector busbar 14, and each another end portion thereof is connected to the second reflector busbar 16.

The reflector 8B includes a first portion 9a in which the lengths of the plurality of first reflective electrode fingers 13 change in the first direction x. More specifically, in the first portion 9a, the lengths of the first reflective electrode finger 13 decrease toward the outer side in the first direction x. As described above, the reflector 8B is a weighted reflector.

Here, an imaginary line formed by coupling the end portions of the plurality of reflective electrode fingers connected to the first reflector busbar 14 is defined as a first imaginary line J. An imaginary line formed by coupling the end portions of the plurality of reflective electrode fingers connected to the second reflector busbar 16 is defined as a second imaginary line K. In the present preferred embodiment, both of the first imaginary line J and the second imaginary line K are inclined relative to the first direction x in the first portion 9a. More specifically, the first imaginary line J extends so as to approach the second reflector busbar 16 toward the outer side in the first direction x. The second imaginary line K extends so as to approach the first reflector busbar 14 toward the outer side in the first direction x. It is sufficient that at least one of the first imaginary line J and the second imaginary line K is inclined relative to the first direction x.

The reflector 8B includes a second portion 9b in which the lengths of the plurality of reflective electrode fingers are constant in the first direction x. In the second portion 9b, the first imaginary line J and the second imaginary line K extend parallel or substantially parallel to the first direction x. The second portion 9b is positioned closer to the side of the plurality of IDT electrodes than the first portion 9a is. Note that the positional relationship between the first portion 9a and the second portion 9b is not limited to the above.

In the present preferred embodiment, the first reflector busbar 14 includes a plurality of cavities 14d along the first direction x in the second portion 9b. The second reflector busbar also includes a plurality of cavities 16d along the first direction x. Among the plurality of first reflective electrode fingers 13 in the first portion 9a, at least the first reflective electrode finger 13 positioned closest to the side of the second portion 9b overlaps the cavities 14d and the cavities 16d when viewed in the first direction x. Note that, when viewed in the first direction x, the reflective electrode finger in the first portion 9a may overlap neither the cavities 14d nor the cavities 16d. Alternatively, the first reflector busbar 14 and the second reflector busbar 16 may include none of the cavities 14d and cavities 16d. The reflector 8B may be provided without the second portion 9b and provided with the first portion 9a alone.

The reflector 8A in FIG. 2 also has the same configuration as the reflector 8B. Note that the reflector 8A is configured to be in line symmetry or substantially in line symmetry with the reflector 8B relative to a symmetry axis extending in the second direction y. More specifically, the reflector 8A includes a first reflector busbar and a second reflector busbar facing each other, and a plurality of first reflective electrode fingers which are connected to both of the first reflector busbar and the second reflector busbar. The reflector 8A includes a first portion in which the lengths of the first reflective electrode finger decrease toward the outer side in the first direction x. As described above, the reflector 8A is a weighted reflector.

Figure 4:
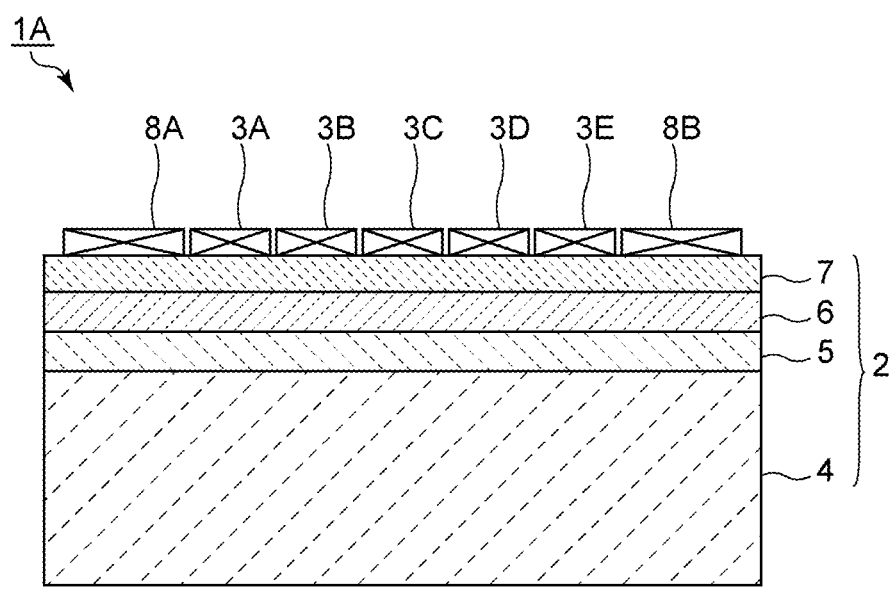
FIG. 4 is a schematic front sectional view illustrating the vicinity of the first longitudinally coupled resonator acoustic wave filter of the filter device according to the first preferred embodiment of the present invention.

FIG. 4 is a schematic front sectional view illustrating the vicinity of the first longitudinally coupled resonator acoustic wave filter of the filter device according to the first preferred embodiment. In FIG. 4, an IDT electrode and a reflector are schematically illustrated with two diagonal lines being added to a rectangle.

The piezoelectric substrate 2 of the present preferred embodiment includes a support substrate 4, a high acoustic velocity film 5 as a high acoustic velocity material layer provided on the support substrate 4, a low acoustic velocity film 6 provided on the high acoustic velocity film 5, and a piezoelectric layer 7 provided on the low acoustic velocity film 6. Note that the piezoelectric substrate 2 may be, for example, a piezoelectric substrate including only of the piezoelectric layer 7.

As a material of the piezoelectric layer 7, a piezoelectric single crystal such as lithium tantalate or lithium niobate or an appropriate piezoelectric ceramic may be used, for example.

The low acoustic velocity film 6 has a relatively low acoustic velocity. More specifically, the acoustic velocity of a bulk wave propagating through the low acoustic velocity film 6 is lower than the acoustic velocity of a bulk wave propagating through the piezoelectric layer 7. In the present preferred embodiment, the low acoustic velocity film 6 is, for example, a silicon oxide film. Silicon oxide is represented by $SiO_x$. x is any positive number. In the first longitudinally coupled resonator acoustic wave filter 1A, silicon oxide of the low acoustic velocity film 6 is, for example, $SiO_2$. Note that the material of the low acoustic velocity film 6 is not limited to the above, and glass, silicon oxynitride, tantalum oxide, or a material including, as a main component, a compound obtained by adding fluorine, carbon, or boron to silicon oxide may be used, for example.

In the present preferred embodiment, the high acoustic velocity material layer is the high acoustic velocity film 5. The high acoustic velocity material layer has a relatively high acoustic velocity. More specifically, the acoustic velocity of a bulk wave propagating through the high acoustic velocity material layer is higher than the acoustic velocity of an acoustic wave propagating through the piezoelectric layer 7. A medium including a material below as a main component may be used as a material of the high acoustic velocity film 5. The material includes, for example, aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a diamond-like carbon (DLC) film, or diamond, for example.

Examples of a material of the support substrate 4 include, for example, piezoelectric materials such as aluminum oxide, lithium tantalate, lithium niobate, and quartz; various ceramics such as alumina, sapphire, magnesia, silicon nitride, aluminum nitride, silicon carbide, zirconia, cordierite, mullite, steatite, and forsterite; dielectrics such as diamond and glass; semiconductors such as silicon and gallium nitride; and resin.

The piezoelectric substrate 2 has a layered structure in which the high acoustic velocity film 5, the low acoustic velocity film 6, and the piezoelectric layer 7 are laminated in this order. This enables the Q factor to be effectively increased, and the energy of the acoustic wave to be effectively confined toward the piezoelectric layer 7.

Here, the first longitudinally coupled resonator acoustic wave filter 1A is an acoustic wave device using a piston mode. The configuration of the IDT electrode of the present preferred embodiment will be described in detail with reference to FIG. 5 illustrating one of the plurality of IDT electrodes.

Figure 5:
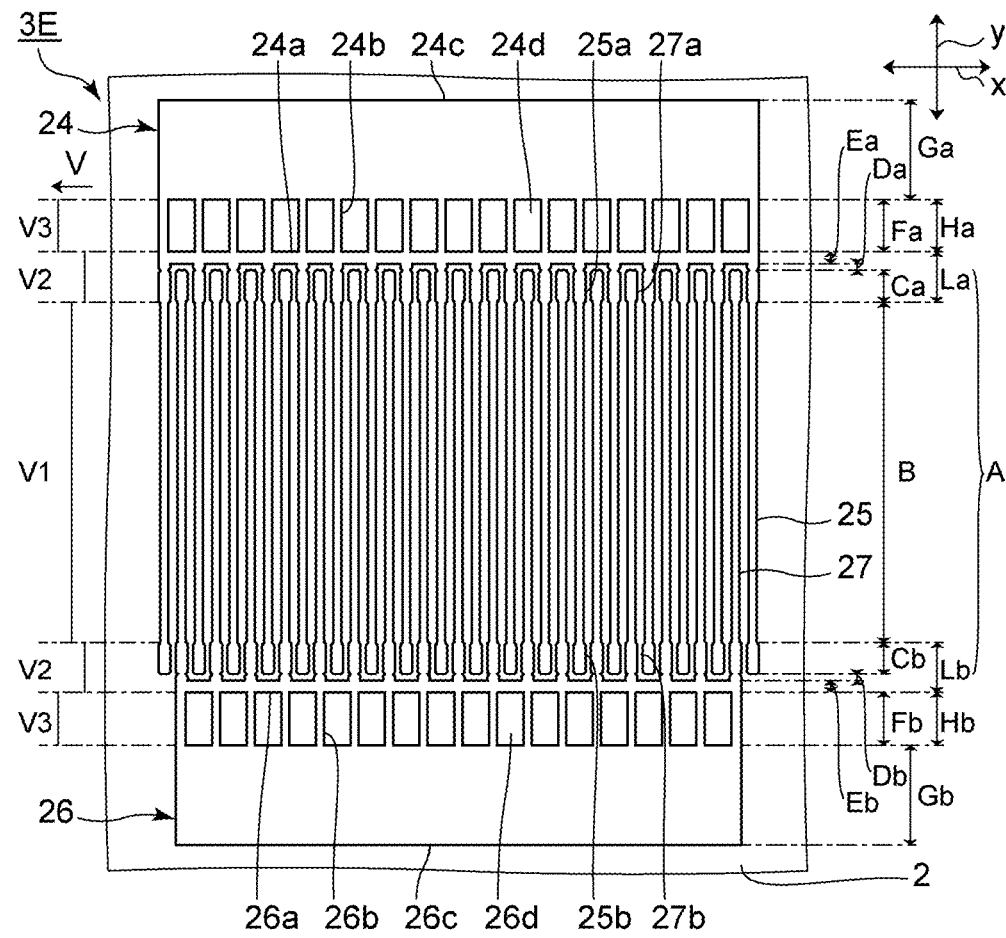
FIG. 5 is a plan view illustrating the vicinity of an IDT electrode in the first longitudinally coupled resonator acoustic wave filter of the filter device according to the first preferred embodiment of the present invention.
Figure 6:
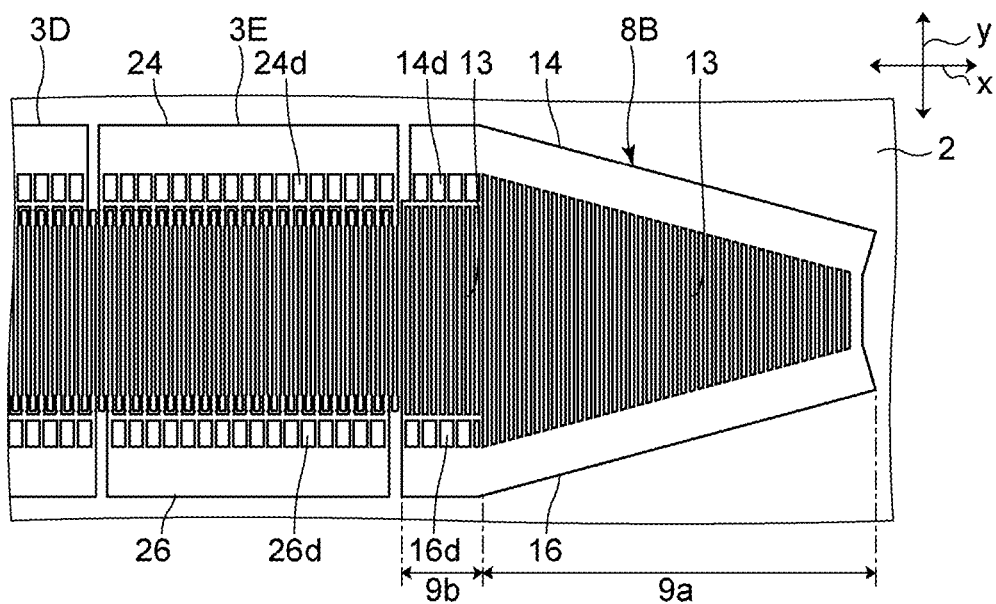
FIG. 6 is a plan view illustrating the vicinity of the reflector and the IDT electrode in the first longitudinally coupled resonator acoustic wave filter of the filter device according to the first preferred embodiment of the present invention.

FIG. 5 is a plan view illustrating the vicinity of the IDT electrode in the first longitudinally coupled resonator acoustic wave filter of the filter device according to the first preferred embodiment. FIG. 6 is a plan view illustrating the vicinity of the reflector and the IDT electrode in the first longitudinally coupled resonator acoustic wave filter of the filter device according to the first preferred embodiment. In FIG. 5, the IDT electrode and the reflector in the vicinity of the reflector in FIG. 6 are omitted. Wires connected to the longitudinally coupled resonator acoustic wave filter are omitted in FIG. 5 and FIG. 6.

As illustrated in FIG. 5, the IDT electrode 3E includes a first busbar 24 and a second busbar 26 facing each other. The first busbar 24 includes a plurality of first cavities 24d along the first direction x. The second busbar 26 also includes a plurality of second cavities 26d along the first direction x. As illustrated in FIG. 6, the first cavities 24d and the cavities 14d of the first reflector busbar 14 overlap each other when viewed in the first direction x in the present preferred embodiment. The second cavities 26d and the cavities 16d of the second reflector busbar 16 overlap each other when viewed in the first direction x.

Returning to FIG. 5, the IDT electrode 3E includes a plurality of first electrode fingers 25 of which each one end portion is connected to the first busbar 24. The other end portion of the first electrode finger 25 faces the second busbar 26 with a gap therebetween. The IDT electrode 3E includes a plurality of second electrode fingers 27 of which each one end portion is connected to the second busbar 26. The other end portion of the second electrode finger 27 faces the first busbar 24 with a gap therebetween. The plurality of first electrode fingers 25 and the plurality of second electrode fingers 27 are interdigitating with each other.

In the IDT electrode 3E, a portion where the first electrode finger 25 and the second electrode finger 27 overlap each other in the first direction x is an intersecting region A. The intersecting region A includes a center region B positioned toward a center in the second direction y.

The intersecting region A includes a first edge region Ca on a side of the center region B toward the first busbar 24 and a second edge region Cb on a side of the center region B toward the second busbar 26. The IDT electrode 3E includes a first gap region Da between the first edge region Ca and the first busbar 24, and a second gap region Db between the second edge region Cb and the second busbar 26.

The first busbar 24 of the IDT electrode 3E includes a first inner busbar region Ea close to the intersecting region A and a first outer busbar region Ga outside the first inner busbar region Ea in the second direction y. In the first busbar 24, a portion in the first inner busbar region Ea is a first inner busbar portion 24a, and a portion in the first outer busbar region Ga is a first outer busbar portion 24c. The first busbar 24 includes a first cavity formation region Fa which is positioned between the first inner busbar region Ea and the first outer busbar region Ga, and includes the plurality of first cavities 24d. The first busbar includes a plurality of first connection electrodes 24b connecting the first inner busbar portion 24a and the first outer busbar portion 24c. Each of the plurality of first cavities 24d is a cavity surrounded by the first inner busbar portion 24a, the first outer busbar portion 24c, and the plurality of first connection electrodes 24b.

The plurality of first connection electrodes 24b extend so as to be positioned on the extension lines of the plurality of first electrode fingers 25. Here, a dimension of the electrode finger along the first direction x is defined as a width. The width of the first connection electrode 24b is the same or substantially the same as the width of the first electrode finger 25. Note that the arrangement of the plurality of first connection electrodes 24b is not limited to the above, and the plurality of first connection electrodes 24b may extend so as to be positioned on the extension lines of the plurality of second electrode fingers 27, for example. The width of the first connection electrode 24b may be different from the width of the first electrode finger 25.

Similarly, the second busbar 26 of the IDT electrode 3E includes a second inner busbar region Eb, a second outer busbar region Gb, and a second cavity formation region Fb in which the plurality of second cavities 26d are provided. A portion positioned in the second inner busbar region Eb is a second inner busbar portion 26a, and a portion positioned in the second outer busbar region Gb is a second outer busbar portion 26c. The second busbar 26 includes a plurality of second connection electrodes 26b connecting the second inner busbar portion 26a and the second outer busbar portion 26c. Each of the plurality of second cavities 26d is a cavity that is surrounded by the second inner busbar portion 26a, the second outer busbar portion 26c, and the plurality of second connection electrodes 26b.

The first electrode finger 25 of the IDT electrode 3E includes a first wide portion 25a, which has a width greater than that of a portion positioned in the center region B, in the portion positioned in the first edge region Ca. Similarly, the second electrode finger 27 includes a first wide portion 27a in the portion positioned in the first edge region Ca. With this configuration, the acoustic velocity in the first edge region Ca is lower than the acoustic velocity in the center region B. As described above, a first low acoustic velocity region La, in which the average acoustic velocity is lower than the acoustic velocity in the center region B, is provided from the first edge region Ca to the first inner busbar region Ea.

The first electrode finger 25 includes a second wide portion 25b, which has a width greater than that of a portion positioned in the center region B, in the portion positioned in the second edge region Cb. Similarly, the second electrode finger 27 includes a second wide portion 27b in the portion positioned in the second edge region Cb. As described above, a second low acoustic velocity region Lb, in which the average acoustic velocity is lower than the acoustic velocity in the center region B, is provided from the second edge region Cb to the second inner busbar region Eb.

Note that at least one of the first electrode finger 25 and the second electrode finger 27 may include the first wide portion 25a or the first wide portion 27a. At least one of the first electrode finger 25 and the second electrode finger 27 may include the second wide portion 25b or the second wide portion 27b. Alternatively, the first low acoustic velocity region La may include a mass addition film in the portion positioned in the first edge region Ca of at least one of the first electrode finger 25 and the second electrode finger 27. The same applies to the second edge region Cb. The first low acoustic velocity region La and the second low acoustic velocity region Lb may include the first wide portion 25a, the first wide portion 27a, the second wide portion 25b, the second wide portion 27b, and the mass addition film.

Here, when the acoustic velocity in the center region B is defined as V1 and the acoustic velocity in the first low acoustic velocity region La and the second low acoustic velocity region Lb is defined as V2, an inequality of V2<V1 is satisfied.

The plurality of first connection electrodes 24b in the first cavity formation region Fa are positioned on the extension lines of the plurality of first electrode fingers 25, but are not positioned on the extension lines of the plurality of second electrode fingers 27. With this configuration, the acoustic velocity in the first cavity formation region Fa is higher than the acoustic velocity in the center region B. As described above, a first high acoustic velocity region Ha is provided in the first cavity formation region Fa. Similarly, in the second cavity formation region Fb, a second high acoustic velocity region Hb is provided in which the acoustic velocity is higher than the acoustic velocity in the center region B. Here, when the acoustic velocity in the first high acoustic velocity region Ha and the second high acoustic velocity region Hb is defined as V3, an inequality of V1<V3 is satisfied. In the present description, the acoustic velocities compared in the center region B, the first low acoustic velocity region La, the second low acoustic velocity region Lb, the first high acoustic velocity region Ha, and the second high acoustic velocity region Hb are the propagation velocities of the acoustic waves in the first direction x.

The relationship between the acoustic velocities in the respective regions satisfies an inequality of V2<V1<V3, for example. FIG. 5 indicates the above-described relationship between the acoustic velocities. In the portion indicating the relationship between the acoustic velocities in FIG. 5, as indicated by an arrow V, the acoustic velocity is higher as the line indicating the height of each acoustic velocity is positioned to the left.

The IDT electrode 3A, the IDT electrode 3B, the IDT electrode 3C, and the IDT electrode 3D in FIG. 2 are also configured in the same or substantially the same manner as the IDT electrode 3E. Note that design parameters of the IDT electrodes may be different from each other depending on desired characteristics. In the first longitudinally coupled resonator acoustic wave filter 1A, the center region B, the first low acoustic velocity region La, and the first high acoustic velocity region Ha are arranged in this order in the second direction y. Similarly, the center region B, the second low acoustic velocity region Lb, and the second high acoustic velocity region Hb are arranged in this order in the second direction y. The first longitudinally coupled resonator acoustic wave filter 1A uses a piston mode by achieving the relationship between the acoustic velocities described above. With this configuration, the Q factor is increased, the energy of the acoustic wave is confined, and a spurious mode due to a high order transverse mode is reduced or prevented. Note that the longitudinally coupled resonator acoustic wave filter according to a preferred embodiment of the present invention does not necessarily use the piston mode.

The IDT electrode 3A, the IDT electrode 3B, the IDT electrode 3C, the IDT electrode 3D, the IDT electrode 3E, the reflector 8A, and the reflector 8B include a laminated metal film in which a plurality of metal layers are laminated, or may be a single-layer metal film. Each IDT electrode and each reflector may be formed by a lift-off method, for example.

The second longitudinally coupled resonator acoustic wave filter 1B in FIG. 1 is configured in the same or substantially the same manner as the first longitudinally coupled resonator acoustic wave filter 1A. Note that the design parameters of longitudinally coupled resonator acoustic wave filters may be different from each other depending on desired filter characteristics. In the present preferred embodiment, the first longitudinally coupled resonator acoustic wave filter 1A and the second longitudinally coupled resonator acoustic wave filter 1B are provided on the same piezoelectric substrate 2.

Similarly, the first acoustic wave resonator P1 and the second acoustic wave resonator S1 are also provided on the piezoelectric substrate 2 on which the first longitudinally coupled resonator acoustic wave filter 1A is provided. Each of the first acoustic wave resonator P1 and the second acoustic wave resonator S1 includes an IDT electrode and a pair of reflectors arranged on both sides of the IDT electrode in the first direction x which are provided on the piezoelectric substrate 2.

In the present preferred embodiment, each reflector in the first longitudinally coupled resonator acoustic wave filter 1A and the second longitudinally coupled resonator acoustic wave filter 1B includes a first portion in which the lengths of the plurality of reflective electrode fingers change in the first direction x. With this configuration, the variations in attenuation may be reduced or prevented in a frequency range near the lower side of the pass band. This will be described below by comparing the present preferred embodiment with a comparative example.

Thirty filter devices having the configuration of the first preferred embodiment and thirty filter devices of the comparative example were manufactured. The comparative example is different from the first preferred embodiment in that the lengths of all of the plurality of reflective electrode fingers are the same or substantially the same in each reflector in the first longitudinally coupled resonator acoustic wave filter and the second longitudinally coupled resonator acoustic wave filter.

The materials and thicknesses of the IDT electrodes and the reflectors, and the conditions of the piezoelectric substrate in the first preferred embodiment and the comparative example are as follows.

Material and thickness of piezoelectric layer: material: LiTaO$_3$, thickness: about 600 nm Material and thicknesses of low acoustic velocity film: material: SiO$_2$, thickness: about 710 nm Material and thicknesses of high acoustic velocity film: material: SiN, thickness: about 200 nm Material of support substrate: material: Si Material and thickness of each IDT electrode and each reflector: material: Al, thickness: about 156 nm The conditions of each resonator according to the first preferred embodiment are as described in Table 1 to Table 3 below. The reflector A, the IDT electrode A, the IDT electrode B, the IDT electrode C, the IDT electrode D, the IDT electrode E, and the reflector B in each table indicate reflectors and IDT electrodes arranged in this order along the first direction x. For example, the reflector A corresponds to the reflector 8A in FIG. 2, and the IDT electrode A corresponds to the IDT electrode 3A. Further, a duty of the IDT electrode in each table indicates the duty in the intersecting region. The number of pairs of the electrode fingers in the reflector is the sum of the number of pairs in the first portion and the second portion. A wavelength determined with an electrode finger pitch of the IDT electrode is denoted by λ. Here, the electrode finger pitch is a distance between the centers of the electrode fingers. A dimension of the intersecting region along the second direction y is defined as an intersecting width.

TABLE 1

| | First longitudinally coupled resonator acoustic wave filter | | | | | | |
|---|---|---|---|---|---|---|---|
| | IDT electrode A | IDT electrode B | IDT electrode C | IDT electrode D | IDT electrode E | Reflector A | Reflector B |
| Intersecting width | 25 | 25 | 25 | 25 | 25 | | |
| Duty | 0.45 | 0.45 | 0.45 | 0.45 | 0.45 | 0.45 | 0.45 |
| Number of pairs of electrode fingers | 32 | 22 | 89 | 22 | 32 | 26.5 | 26.5 |
| Wavelength | 2.12873 | 2.0808 | 2.1287 | 2.0808 | 2.12873 | 2.1323 | 2.1323 |

TABLE 2

| | Second longitudinally coupled resonator acoustic wave filter | | | | | | |
|---|---|---|---|---|---|---|---|
| | IDT electrode A | IDT electrode B | IDT electrode C | IDT electrode D | IDT electrode E | Reflector A | Reflector B |
| Intersecting width | 25 | 25 | 25 | 25 | 25 | | |
| Duty | 0.45 | 0.45 | 0.45 | 0.45 | 0.45 | 0.45 | 0.45 |
| Number of pairs of electrode fingers | 32 | 22 | 89 | 22 | 32 | 26.5 | 26.5 |
| Wavelength | 2.12873 | 2.0808 | 2.1287 | 2.0808 | 2.12873 | 2.1323 | 2.1323 |

TABLE 3

| | First acoustic wave resonator | | | Second acoustic wave resonator | | |
|---|---|---|---|---|---|---|
| | IDT electrode | Reflector A | Reflector B | IDT electrode | Reflector A | Reflector B |
| Intersecting width | 60 | | | 22 | | |
| Duty | 0.5 | 0.5 | 0.5 | 0.5 | 0.5 | 0.5 |
| Number of pairs of electrode fingers | 85 | 11 | 11 | 76 | 14 | 14 |
| Wavelength | 2.1479 | 2.1479 | 2.1479 | 2.0463 | 2.0463 | 2.0463 |

The conditions of each resonator in the comparative example are as described in Table 4 to Table 6 below.

TABLE 4

| | First longitudinally coupled resonator acoustic wave filter | | | | | | |
|---|---|---|---|---|---|---|---|
| | IDT electrode A | IDT electrode B | IDT electrode C | IDT electrode D | IDT electrode E | Reflector A | Reflector B |
| Intersecting width | 25 | 25 | 25 | 25 | 25 | | |
| Duty | 0.45 | 0.45 | 0.45 | 0.45 | 0.45 | 0.45 | 0.45 |
| Number of pairs of electrode fingers | 32 | 22 | 89 | 22 | 32 | 18 | 18 |
| Wavelength | 2.12873 | 2.0808 | 2.1287 | 2.0808 | 2.12873 | 2.1323 | 2.1323 |

TABLE 5

| | Second longitudinally coupled resonator acoustic wave filter | | | | | | |
|---|---|---|---|---|---|---|---|
| | IDT electrode A | IDT electrode B | IDT electrode C | IDT electrode D | IDT electrode E | Reflector A | Reflector B |
| Intersecting width | 25 | 25 | 25 | 25 | 25 | | |
| Duty | 0.45 | 0.45 | 0.45 | 0.45 | 0.45 | 0.45 | 0.45 |
| Number of pairs of electrode fingers | 32 | 22 | 89 | 22 | 32 | 18 | 18 |
| Wavelength | 2.12873 | 2.0808 | 2.1287 | 2.0808 | 2.12873 | 2.1323 | 2.1323 |

TABLE 6

| | First acoustic wave resonator | | | Second acoustic wave resonator | | |
|---|---|---|---|---|---|---|
| | IDT electrode | Reflector A | Reflector B | IDT electrode | Reflector A | Reflector B |
| Intersecting width | 60 | | | 22 | | |
| Duty | 0.5 | 0.5 | 0.5 | 0.5 | 0.5 | 0.5 |
| Number of pairs of electrode fingers | 85 | 11 | 11 | 76 | 14 | 14 |
| Wavelength | 2.1479 | 2.1479 | 2.1479 | 2.0463 | 2.0463 | 2.0463 |

The unit of the intersecting width and the wavelength in Table 1 to Table 6 is μm. The attenuation-frequency characteristics of each filter device was measured.

Figure 7:
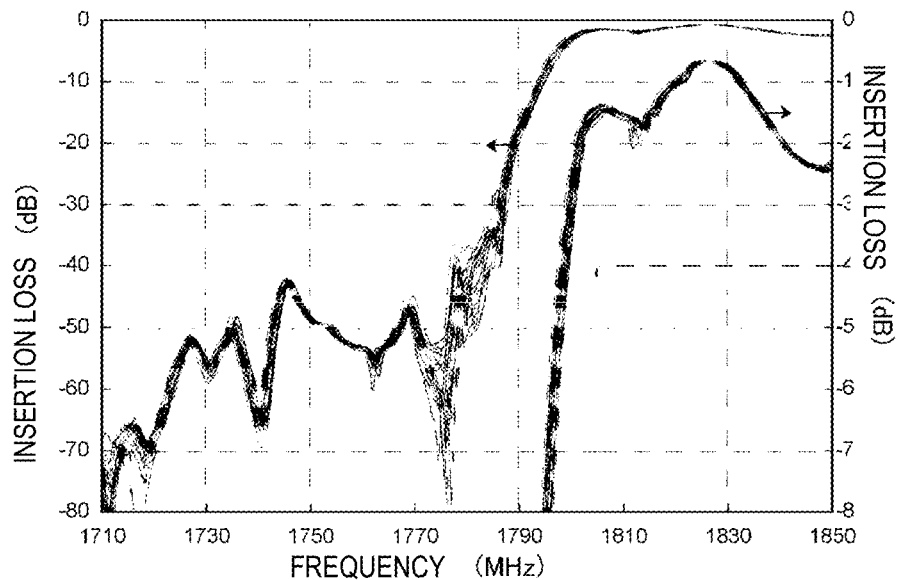
FIG. 7 is a graph illustrating attenuation-frequency characteristics of each filter device of a comparative example.
Figure 8:
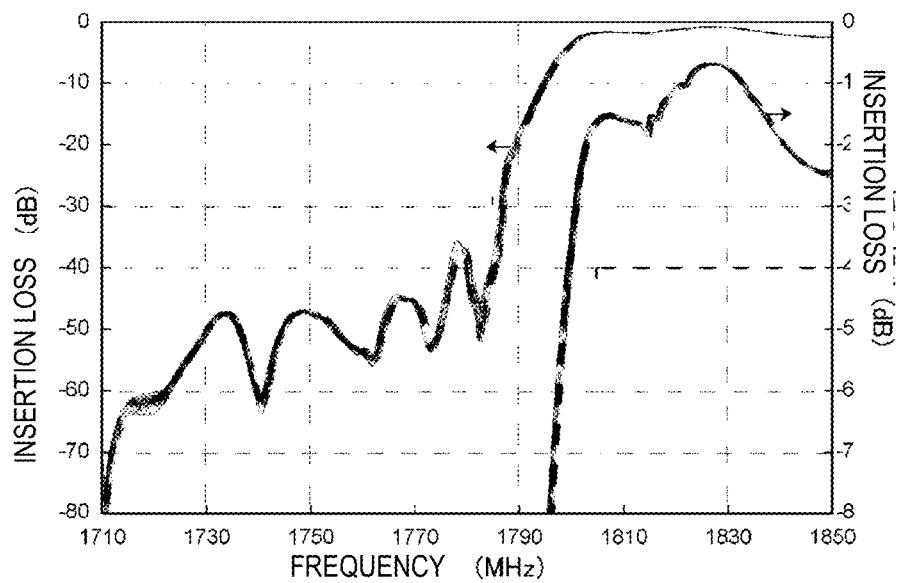
FIG. 8 is a graph illustrating attenuation-frequency characteristics of each filter device having the configuration of the first preferred embodiment of the present invention.

FIG. 7 is a graph illustrating the attenuation-frequency characteristics of each filter device of the comparative example. FIG. 8 is a graph illustrating the attenuation-frequency characteristics of each filter device having the configuration of the first preferred embodiment.

As illustrated in FIG. 7, in the comparative example, it is seen that the attenuation greatly varies in a frequency range near the lower side of the pass band. Whereas, as illustrated in FIG. 8, in the first preferred embodiment, it is seen that the variation in attenuation in a frequency range near the lower frequency side of the pass band is small.

The plurality of IDT electrodes in the longitudinally coupled resonator acoustic wave filter practically poses an issue of variations in the width of the electrode fingers because of the influence of, for example, the planarity of the piezoelectric substrate. When a piezoelectric substrate including the high acoustic velocity material layer and the piezoelectric layer is provided, the Q factor may be increased, but the influence of the variations in the width of the electrode fingers of the IDT electrode on the attenuation also increase. Accordingly, in the comparative example, a large variation in attenuation is induced in a frequency range near the lower side of the pass band even when the variation in the width of the electrode finger is small.

Whereas, the filter device 10 of the first preferred embodiment in FIG. 1 includes weighted reflectors in the first longitudinally coupled resonator acoustic wave filter 1A and the second longitudinally coupled resonator acoustic wave filter 1B, in addition to including the piezoelectric substrate 2 including the high acoustic velocity material layer and the piezoelectric layer 7. More specifically, the lengths of the plurality of first reflective electrode fingers 13 change in the first direction x in the reflector 8B as illustrated in FIG. 3.

Accordingly, the number of pairs of the first reflective electrode fingers 13 substantially changes in the second direction y in the reflector 8B. In the first preferred embodiment, the number of pairs of the first reflective electrode fingers 13 increases from the outer side towards the inner side in the second direction y. The same applies to each of the reflectors in the first longitudinally coupled resonator acoustic wave filter 1A and the second longitudinally coupled resonator acoustic wave filter 1B other than the reflector 8B. Thus, the response outside the stop band may be dispersed, and the attenuation characteristics may be smooth in a frequency range near the lower side of the pass band. With this, the influence of, for example, the variations in the width of the electrode fingers of the IDT electrode on the attenuation may be reduced. Accordingly, the Q factor may be increased, and the variations in attenuation may be reduced or prevented in a frequency range near the lower side of the pass band. Note that, even in a case in which the piezoelectric substrate includes only the piezoelectric layer 7, the influence of, for example, the variations in the width of the electrode fingers of the IDT electrode on the attenuation may be reduced. Thus, also in this case, the variations in attenuation may be reduced or prevented in a frequency range near the lower side of the pass band.

The reflector 8B preferably includes the second portion 9b in addition to the first portion 9a as illustrated in FIG. 3. It is more preferable that the second portion 9b is positioned closer to the side of the plurality of IDT electrodes than the first portion 9a is. With this, the acoustic wave may suitably be reflected to the side of the plurality of IDT electrodes without increasing the size of the reflector 8B. It is further preferable that the plurality of first reflective electrode fingers 13 in the second portion 9b overlap at least a portion of the first gap region and the second gap region when viewed in the first direction x as illustrated in FIG. 5 and FIG. 6. It is even more preferable that the plurality of first reflective electrode fingers 13 in the second portion 9b overlap all of the first gap region and the second gap region when viewed in the first direction x. With this configuration, the reflector 8B may more reliably and suitably reflect an acoustic wave to the side of the plurality of IDT electrodes. The same applies to each of the reflectors in the first longitudinally coupled resonator acoustic wave filter 1A and the second longitudinally coupled resonator acoustic wave filter 1B other than the reflector 8B.

Figure 9:
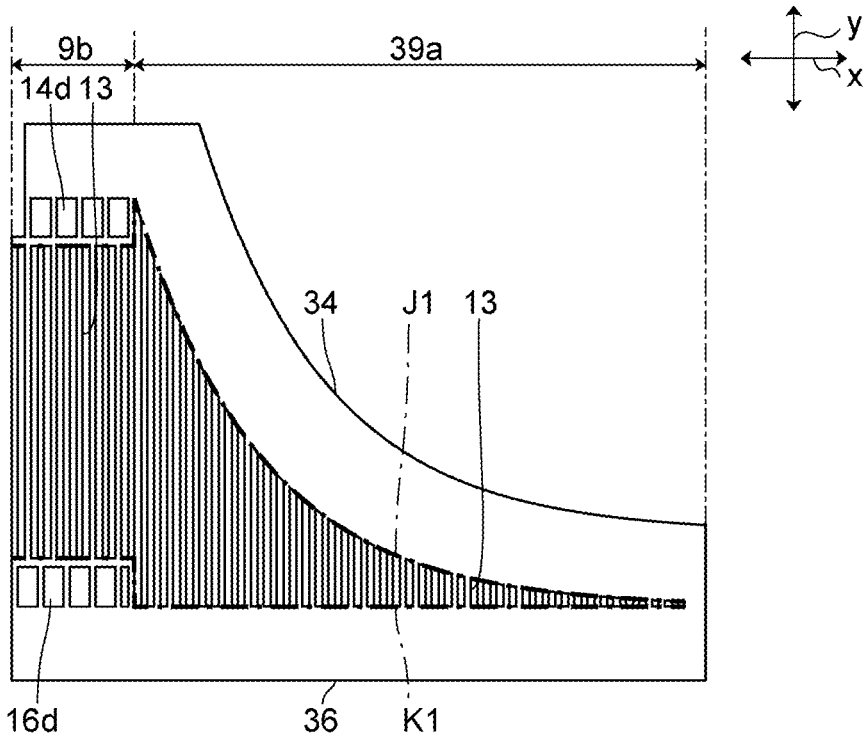
FIG. 9 is a plan view of a reflector in a first longitudinally coupled resonator acoustic wave filter according to a first modification of the first preferred embodiment of the present invention.

In the first preferred embodiment, both of the first imaginary line J and the second imaginary line K are inclined relative to the first direction x, and are linear as illustrated in FIG. 3. Note that a configuration of weighting of each reflector is not limited to the above. In a first modification in FIG. 9, for example, the first imaginary line J1 is inclined relative to the first direction x and has a curved shape in a first portion 39a. Note that a first reflector busbar 34 also has a curved shape. Whereas, the second imaginary line K1 and a second reflector busbar 36 extend parallel or substantially parallel to the first direction x. Also in this case, similarly to the first preferred embodiment, the Q factor may be increased, and the variations in attenuation may be reduced or prevented in a frequency range near the lower side of the pass band.

Figure 10:
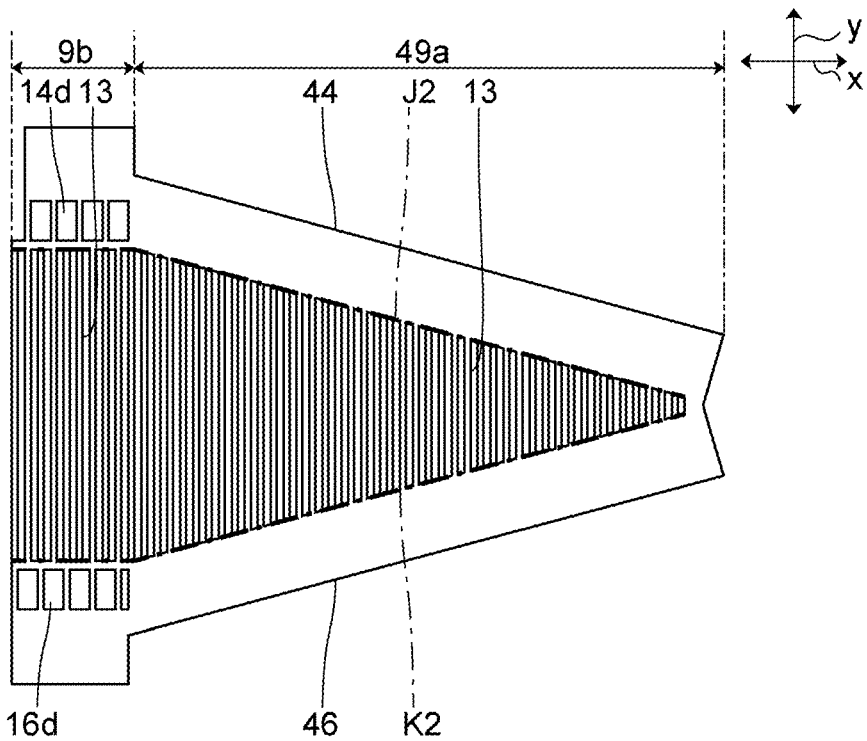
FIG. 10 is a plan view of a reflector in a first longitudinally coupled resonator acoustic wave filter according to a second modification of the first preferred embodiment of the present invention.

FIG. 10 is a plan view of a reflector in a first longitudinally coupled resonator acoustic wave filter according to a second modification of the first preferred embodiment.

The present modification is different from the first preferred embodiment in that all of the first reflective electrode fingers 13 in a first portion 49a of the reflector overlap neither the cavities 14d nor the cavities 16d in the second portion 9b when viewed in the first direction x. In the present modification, the lengths of the first reflective electrode fingers 13 in the first portion 49a are equal to or less than the length of the first reflective electrode fingers 13 in the second portion 9b. All of the portions of the first imaginary line J2 and the second imaginary line K2 overlap the first reflective electrode fingers 13 in the second portion 9b when viewed in the first direction x.

The filter device of the present modification also includes the same or substantially the same piezoelectric substrate as that of the first preferred embodiment, and each of the reflectors in the first longitudinally coupled resonator acoustic wave filter and the second longitudinally coupled resonator acoustic wave filter is weighted. Thus, the Q factor may be increased, and the variations in attenuation may be reduced or prevented in a frequency range near the lower side of the pass band.

In the first preferred embodiment, the plurality of first cavities 24d are provided in the first busbar 24 of the IDT electrode 3E as illustrated in FIG. 5. The first high acoustic velocity region Ha is provided in the first cavity formation region Fa in the first busbar 24, and the first low acoustic velocity region La is provided from the first edge region Ca to the first inner busbar region Ea. Note that none of the cavities may be provided in the first busbar 24. In this case, the first high acoustic velocity region Ha may be provided in the first gap region Da, and the first low acoustic velocity region La may be provided in the first edge region Ca. Similarly, none of the cavities may be provided in the second busbar 26. The second high acoustic velocity region Hb may be provided in the second gap region Db, and the second low acoustic velocity region Lb may be provided in the second edge region Cb. The same applies to each of the IDT electrodes in the first longitudinally coupled resonator acoustic wave filter 1A and the second longitudinally coupled resonator acoustic wave filter 1B other than the IDT electrode 3E.

The piezoelectric substrate 2 of the first preferred embodiment includes a multilayer body in which the support substrate 4, the high acoustic velocity film 5, the low acoustic velocity film 6, and the piezoelectric layer 7 are laminated in this order, as illustrated in FIG. 4. The piezoelectric layer 7 is indirectly provided over the high acoustic velocity film 5 as the high acoustic velocity material layer with the low acoustic velocity film 6 therebetween. Note that the configuration of the piezoelectric substrate 2 is not limited to the above. Hereinafter, a third modification and a fourth modification of the first preferred embodiment, which are different from the first preferred embodiment only in the configuration of the piezoelectric substrate 2, will be described. Also in the third modification and the fourth modification, similarly to the first preferred embodiment, the Q factor may be increased and the variations in attenuation may be reduced or prevented in a frequency range near the lower side of the pass band.

Figure 11:
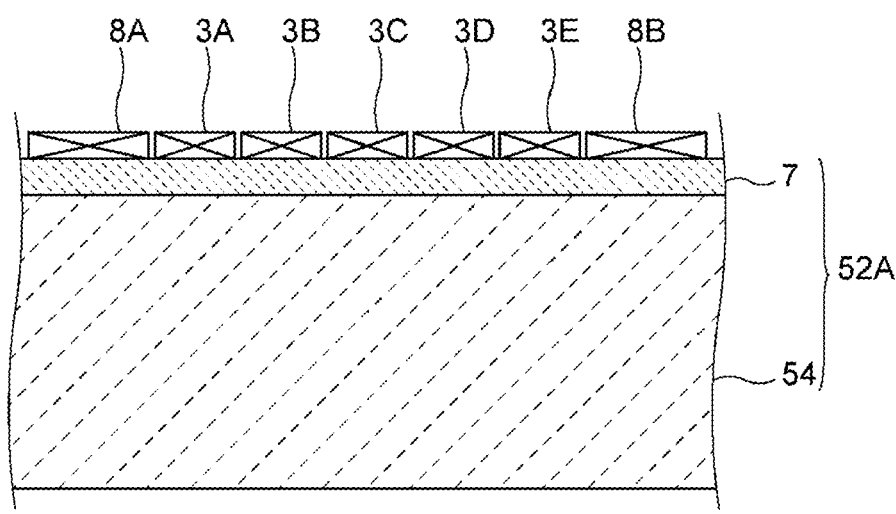
FIG. 11 is a schematic front sectional view illustrating the vicinity of a first longitudinally coupled resonator acoustic wave filter of a filter device according to a third modification of the first preferred embodiment of the present invention.

In the third modification illustrated in FIG. 11, the high acoustic velocity material layer is a high acoustic velocity support substrate 54. A piezoelectric substrate 52A of the present modification includes the high acoustic velocity support substrate 54 and the piezoelectric layer 7 directly provided on the high acoustic velocity support substrate 54.

A medium including a material below as a main component may be used as a material of the high acoustic velocity support substrate 54. The material includes aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a DLC film, or diamond, for example.

Figure 12:
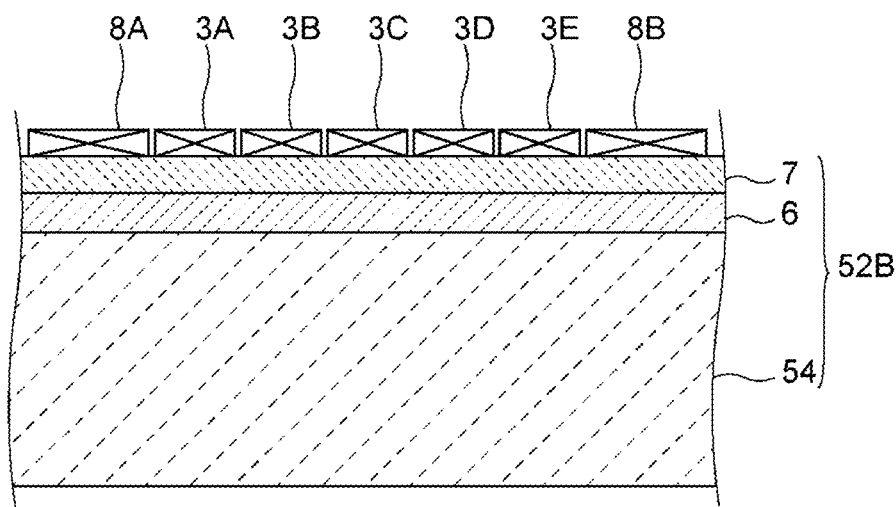
FIG. 12 is a schematic front sectional view illustrating the vicinity of a first longitudinally coupled resonator acoustic wave filter of a filter device according to a fourth modification of the first preferred embodiment of the present invention.

A piezoelectric substrate 52B of the fourth modification in FIG. 12 includes the high acoustic velocity support substrate 54, the low acoustic velocity film 6 provided on the high acoustic velocity support substrate 54, and the piezoelectric layer 7 provided on the low acoustic velocity film 6.

Figure 13:
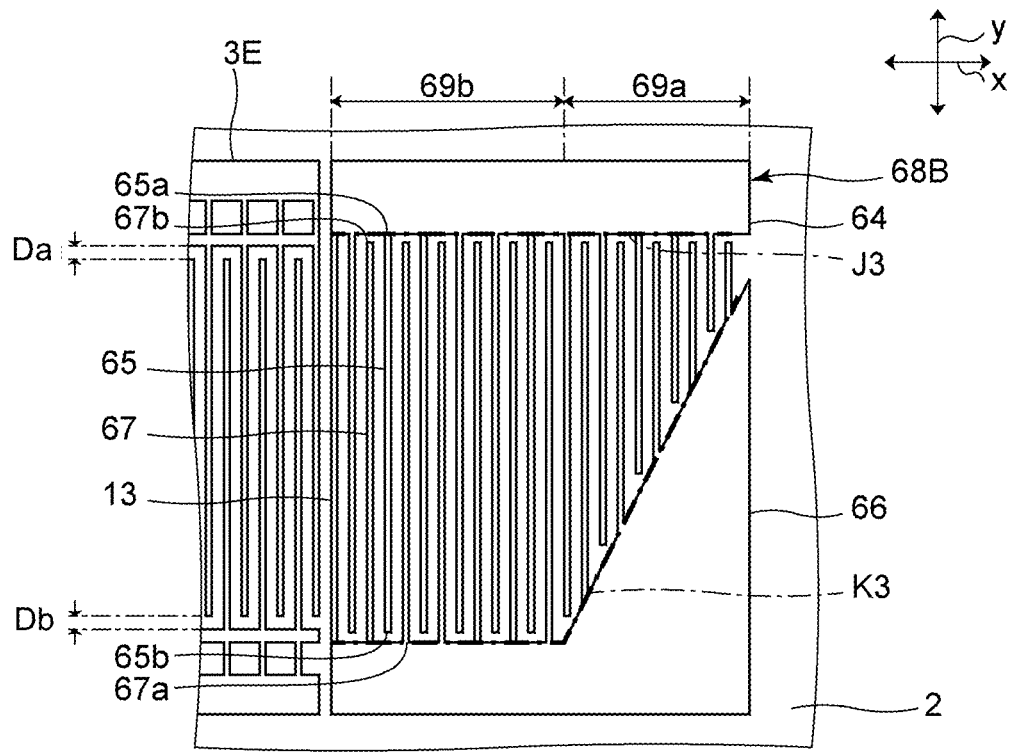
FIG. 13 is a plan view illustrating the vicinity of a reflector of a longitudinally coupled resonator acoustic wave filter according to a second preferred embodiment of the present invention.

FIG. 13 is a plan view illustrating the vicinity of the reflector of the longitudinally coupled resonator acoustic wave filter according to the second preferred embodiment.

The longitudinally coupled resonator acoustic wave filter of the present preferred embodiment is different from the first longitudinally coupled resonator acoustic wave filter 1A according to the first preferred embodiment in the configuration of each reflector. Other than the aspect above, the longitudinally coupled resonator acoustic wave filter of the present preferred embodiment has a configuration similar to that of the first longitudinally coupled resonator acoustic wave filter 1A according to the first preferred embodiment.

In a first portion 69a of a reflector 68B, the first imaginary line J3 extends parallel or substantially parallel to the first direction x as illustrated in FIG. 13. Whereas, the second imaginary line K3 is inclined relative to the first direction x. When a line connecting end portions of the plurality of reflective electrode fingers not connected to a second reflector busbar 66 is defined as a third imaginary line, the third imaginary line is also inclined relative to the first direction x in the first portion 69a. Each of a first reflector busbar 64 and the second reflector busbar 66 of the present preferred embodiment includes no cavities.

The reflector 68B includes a plurality of second reflective electrode fingers 65 and a plurality of third reflective electrode fingers 67 in addition to the first reflective electrode fingers 13. Each of the plurality of second reflective electrode fingers 65 includes a first end portion 65a and a second end portion 65b. The first end portion 65a is connected to the first reflector busbar 64, and the second end portion 65b faces the second reflector busbar 66 with a gap therebetween. Similarly, each of the plurality of third reflective electrode fingers 67 includes a third end portion 67a and a fourth end portion 67b. The third end portion 67a is connected to the second reflector busbar 66, and the fourth end portion 67b faces the first reflector busbar 64 with a gap therebetween. The plurality of second reflective electrode fingers 65 and the plurality of third reflective electrode fingers 67 are interdigitating with each other.

The reflector 68B of the present preferred embodiment includes one first reflective electrode finger 13. The first reflective electrode finger 13 is a reflective electrode finger, among the plurality of reflective electrode fingers, positioned closest to the side of the plurality of IDT electrodes. The number and position of the first reflective electrode fingers 13 are not limited to those described above.

One end portion of the first reflective electrode finger 13, the first end portion 65a of the second reflective electrode finger 65, and the fourth end portion 67b of the third reflective electrode finger 67 that are in a second portion 69b overlap the first busbar of the plurality of IDT electrodes when viewed in the first direction x. Similarly, the other end portion of the first reflective electrode finger 13, the second end portion 65b of the second reflective electrode finger 65, and the third end portion 67a of the third reflective electrode finger 67 that are in the second portion 69b overlap the second busbar of the plurality of IDT electrodes when viewed in the first direction x. Thus, the first reflective electrode finger 13, the plurality of second reflective electrode fingers 65, and the plurality of third reflective electrode fingers 67 that are in the second portion 69b overlap all of the first gap region Da and the second gap region Db when viewed in the first direction x. With this, the acoustic wave may more reliably and suitably be reflected to the side of the plurality of IDT electrodes. Note that the positions of the second end portion 65b and the fourth end portion 67b are not limited to those described above.

In addition to the reflector 68B, the reflector sandwiching the plurality of IDT electrodes with the reflector 68B also has the same or similar configuration as that of the reflector 68B. Note that the reflector is configured to be in line symmetry or substantially in line symmetry with the reflector 68B relative to a symmetry axis extending in the second direction y.

The longitudinally coupled resonator acoustic wave filter of the present preferred embodiment also includes a piezoelectric substrate the same as or similar to that of the first preferred embodiment, and each reflector is weighted. Accordingly, the Q factor may be increased, and the variations in attenuation may be reduced or prevented in a frequency range near the lower side of the pass band.

The longitudinally coupled resonator acoustic wave filter of the present preferred embodiment is formed by a lift-off method, for example. This will be described in detail below.

Figure 14:
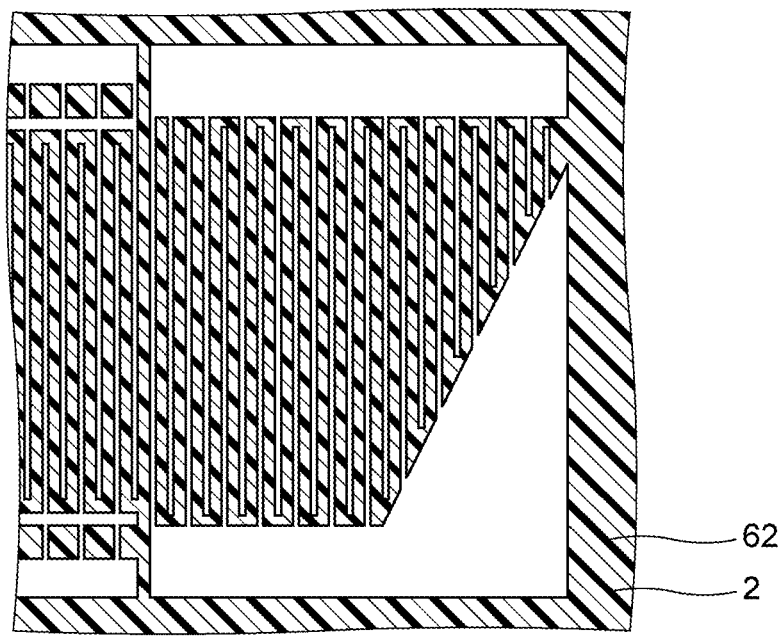
FIG. 14 is a plan view of the vicinity of a portion corresponding to the reflector for describing an example of a non-limiting method of manufacturing the longitudinally coupled resonator acoustic wave filter according to the second preferred embodiment of the present invention.
Figure 15:
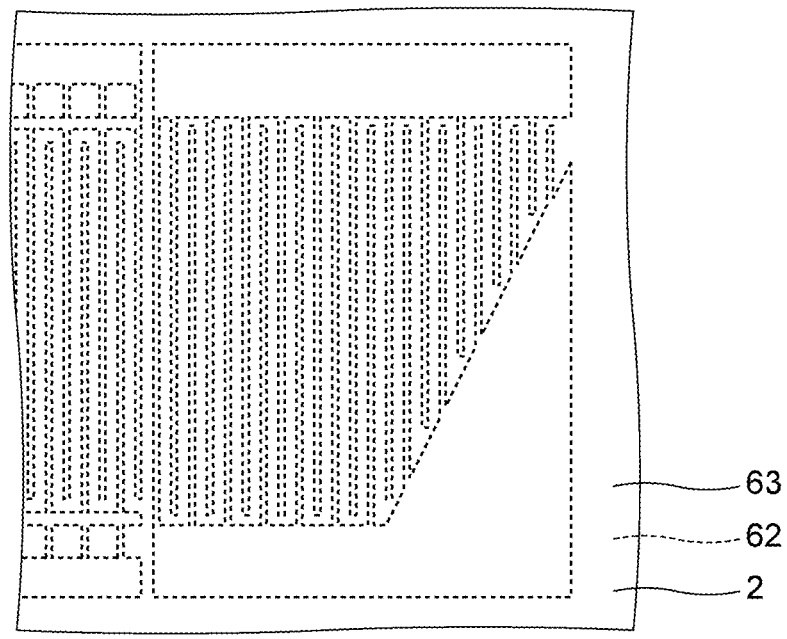
FIG. 15 is a plan view of the vicinity of the portion corresponding to the reflector for describing an example of the non-limiting method of manufacturing the longitudinally coupled resonator acoustic wave filter according to the second preferred embodiment of the present invention.

FIG. 14 is a plan view of the vicinity of a portion corresponding to the reflector for describing a non-limiting example of a method of manufacturing the longitudinally coupled resonator acoustic wave filter according to the second preferred embodiment. FIG. 15 is a plan view of the vicinity of a portion corresponding to the reflector for describing an example of the method of manufacturing the longitudinally coupled resonator acoustic wave filter according to the second preferred embodiment.

As illustrated in FIG. 14, the piezoelectric substrate 2 is prepared. Next, a resist layer is formed on the piezoelectric substrate 2. The resist layer may be formed by a printing method or a spin coating method, for example. Next, the resist layer is exposed and then developed to form a resist pattern 62. At this time, in plan view, the resist layer is continuous in the vicinity of a portion of the second end portion of the second reflective electrode finger of the reflector in the resist pattern 62. The resist layer is also continuous in the vicinity of a portion forming the fourth end portion of the third reflective electrode finger of the reflector in the resist pattern 62. The same applies to a portion corresponding to the other reflector in the resist pattern 62. Thus, in addition to the regions corresponding to the spaces between the respective reflective electrode fingers, regions corresponding to the spaces between the respective reflector busbars and the respective reflective electrode fingers may be provided. Thus, it is possible to provide a continuous wide region surrounded by the respective reflector busbars and the respective reflective electrode fingers.

Next, as illustrated in FIG. 15, a metal film 63 for forming the respective IDT electrodes and the respective reflectors is formed on the piezoelectric substrate 2 so as to cover the resist pattern 62. The metal film 63 may be formed by a vacuum deposition method or a sputtering method, for example.

Next, the resist pattern 62 is removed. At this time, as described above, the resist layer includes a continuous portion in the portion corresponding to the respective reflectors in the resist pattern 62. Thus, a continuous wide region surrounded by the respective reflector busbars and the respective reflective electrode fingers may be provided, and the resist removing solution readily comes into contact with the resist. With this, the resist pattern 62 may easily and more reliably be removed. Accordingly, in the present preferred embodiment, the residue of the resist is less likely to remain.

Further, in the present preferred embodiment, the first reflective electrode finger 13 connected to both of the first reflector busbar 64 and the second reflector busbar 66 is provided as illustrated in FIG. 13. With this configuration, all of the reflective electrode fingers of the reflector 68B are set to have the same or substantially the same potential, and this makes it possible to reduce or prevent the excitation of an acoustic wave in the reflector 68B. The same applies to the reflector sandwiching the plurality of IDT electrodes with the reflector 68B. Accordingly, ripples in the pass band may be reduced or prevented.

Figure 16:
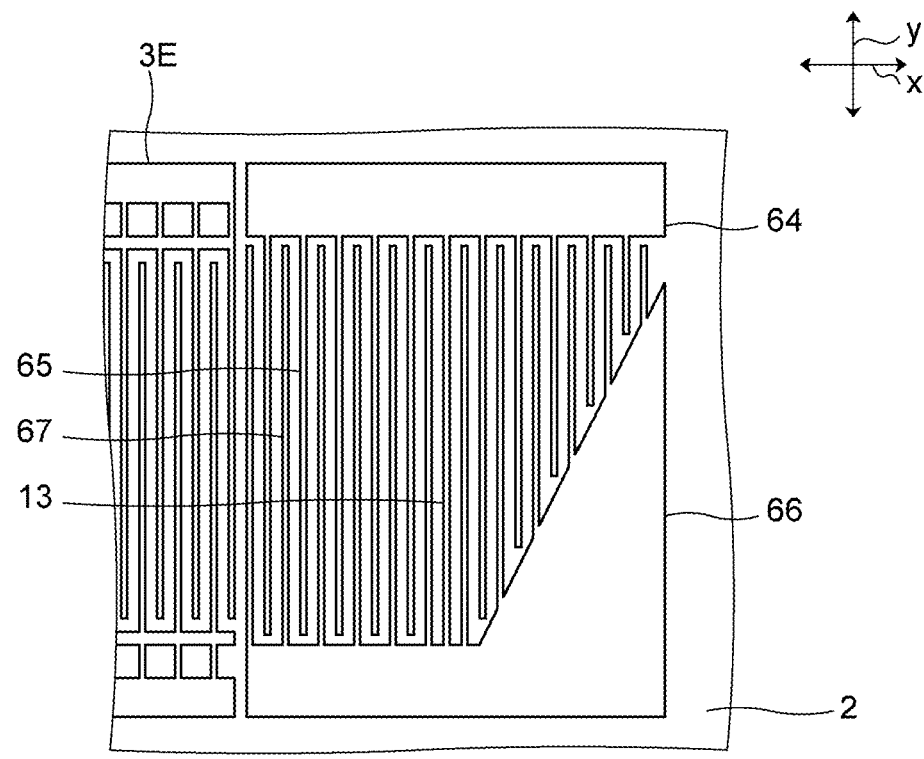
FIG. 16 is a plan view of the vicinity of a reflector in a longitudinally coupled resonator acoustic wave filter according to a first modification of the second preferred embodiment of the present invention.
Figure 17:
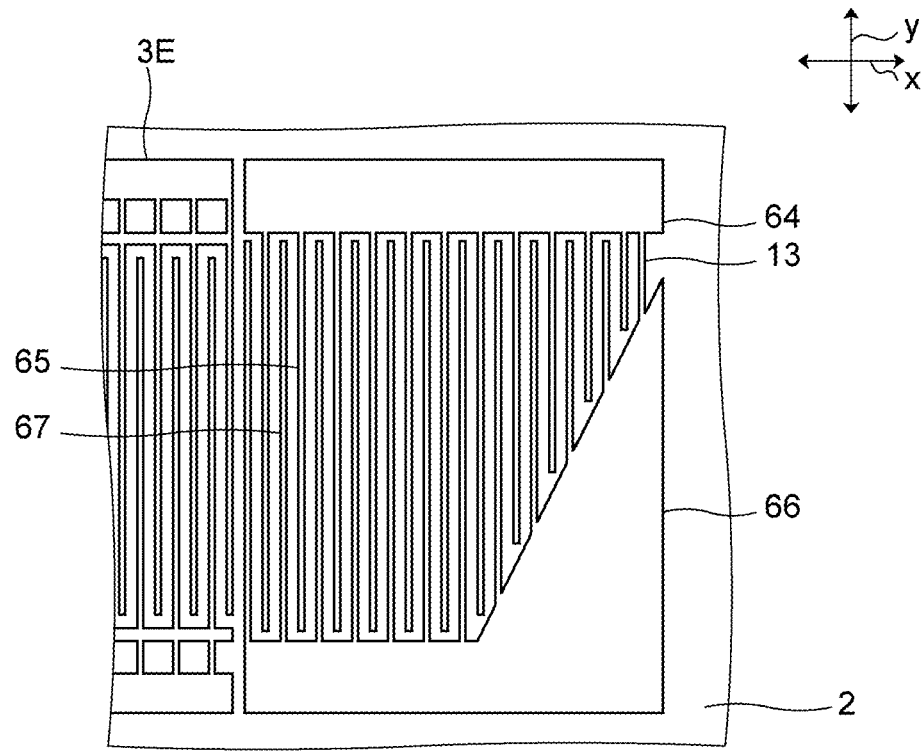
FIG. 17 is a plan view of the vicinity of a reflector in a longitudinally coupled resonator acoustic wave filter according to a second modification of the second preferred embodiment of the present invention.

As described above, the number and positions of the first reflective electrode fingers 13 are not particularly limited. For example, in the first modification illustrated in FIG. 16, the first reflective electrode finger 13 is a reflective electrode finger positioned in the vicinity of the center in the first direction x among the plurality of reflective electrode fingers. In the second modification of the second preferred embodiment illustrated in FIG. 17, the first reflective electrode finger 13 is a reflective electrode finger, among the plurality of reflective electrode fingers, farthest from the plurality of IDT electrodes.

Figure 18:
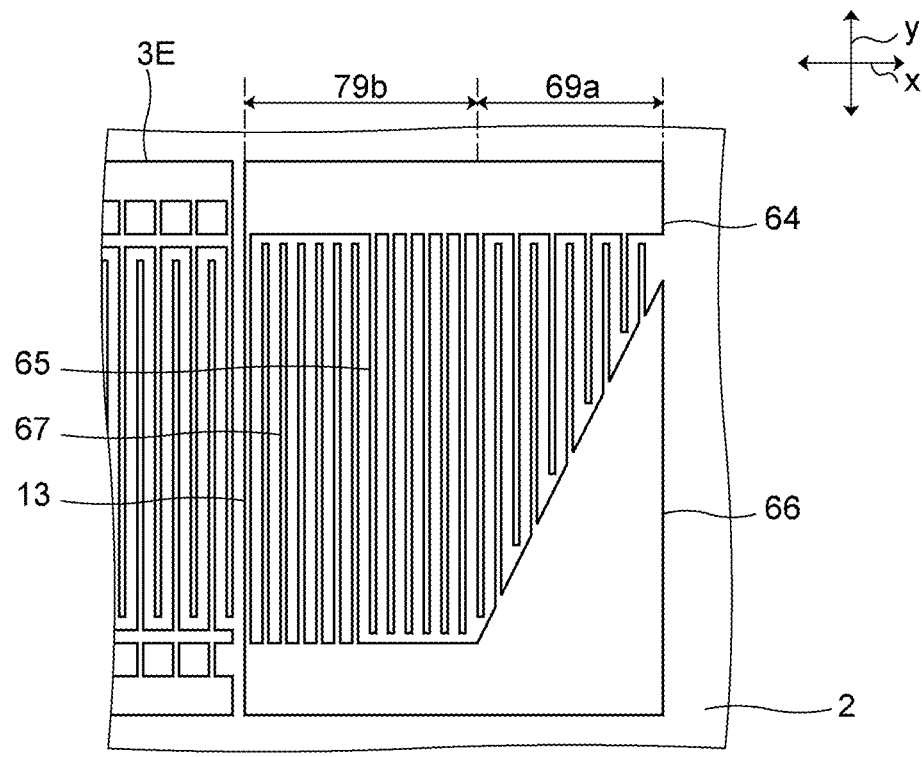
FIG. 18 is a plan view of the vicinity of a reflector in a longitudinally coupled resonator acoustic wave filter according to a third modification of the second preferred embodiment of the present invention.

As illustrated in FIG. 13, in the present preferred embodiment, the plurality of second reflective electrode fingers 65 and the plurality of third reflective electrode fingers 67 are interdigitating with each other, but the arrangement of the plurality of second reflective electrode fingers 65 and the plurality of third reflective electrode fingers 67 is not limited to the arrangement described in FIG. 13. For example, in a third modification of the second preferred embodiment illustrated in FIG. 18, a plurality of second reflective electrode fingers 65 are continuously arranged in the first direction x in a second portion 79b. Similarly, a plurality of third reflective electrode fingers 67 are continuously arranged in the first direction x. In the first portion 69a, similarly to the second preferred embodiment, a plurality of second reflective electrode fingers 65 and a plurality of third reflective electrode fingers 67 are interdigitating with each other.

The reflector 68B may include one of the second reflective electrode finger 65 and the third reflective electrode finger 67, and the first reflective electrode finger 13. Note that the reflector 68B preferably includes both of the second reflective electrode finger 65 and the third reflective electrode finger 67, and the first reflective electrode finger 13. With this, the level of symmetry of the reflector 68B may be improved, and the filter characteristic is less likely to deteriorate.

Hereinafter, "overlapping when viewed in the first direction" may simply be referred to as "overlapping" to describe the positional relationship between the first reflective electrode finger and the IDT electrode. In the first preferred embodiment, at least the first reflective electrode finger 13 positioned closest to the side of the IDT electrode 3E in the first portion 9a of the reflector 8B overlaps the entire or substantially the entire intersecting region A when viewed in the first direction x as illustrated in FIG. 5 and FIG. 6. Further, the first reflective electrode finger 13 extends so as to overlap both of the first cavity formation region Fa and the second cavity formation region Fb. Whereas, none of the first reflective electrode fingers 13 overlaps the first outer busbar region Ga and the second outer busbar region Gb of the IDT electrode 3E. Thus, the weighted portion of the reflector 8B overlaps the center region B, the first edge region Ca, the first gap region Da, the first inner busbar region Ea, and the first cavity formation region Fa. Further, the weighted portion of the reflector 8B overlaps the second edge region Cb, the second gap region Db, the second inner busbar region Eb, and the second cavity formation region Fb. The same applies to the reflector 8A.

In longitudinally coupled resonator acoustic wave filters according to third to fifth preferred embodiments of the present invention described below are different from the first preferred embodiment in the arrangement of weighted portions of the reflectors. Return losses in the longitudinally coupled resonator acoustic wave filters according to the third to fifth preferred embodiments and the return loss in a comparative example will be compared. Note that the reflector is not weighted in the comparative example.

Figure 19:
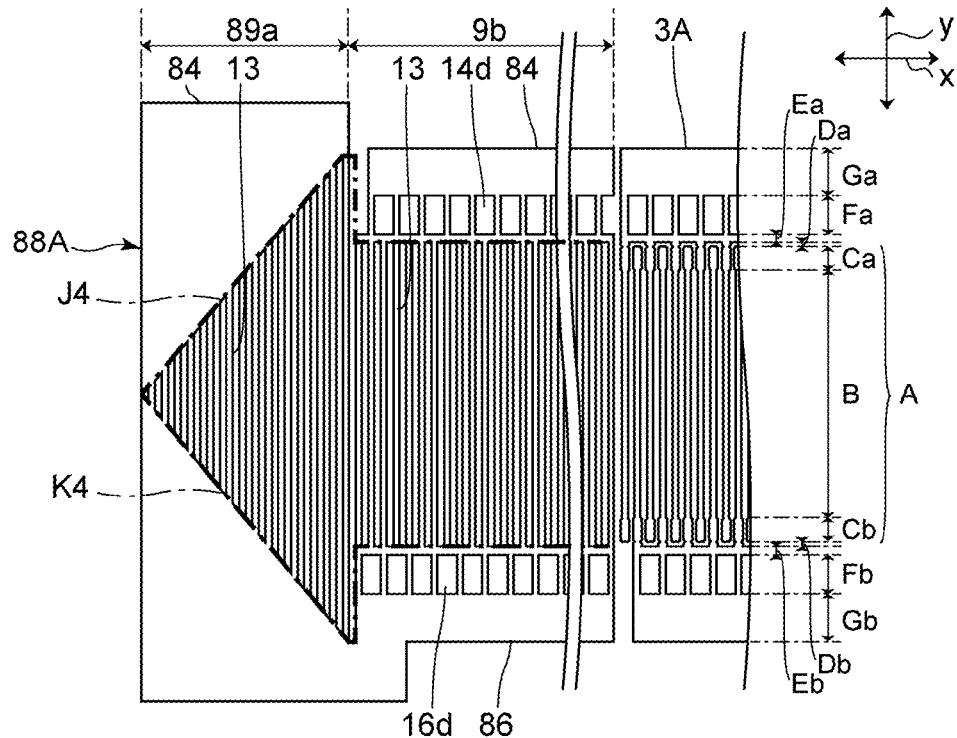
FIG. 19 is a plan view of a reflector and a part of an IDT electrode of a longitudinally coupled resonator acoustic wave filter according to a third preferred embodiment of the present invention.
Figure 20:
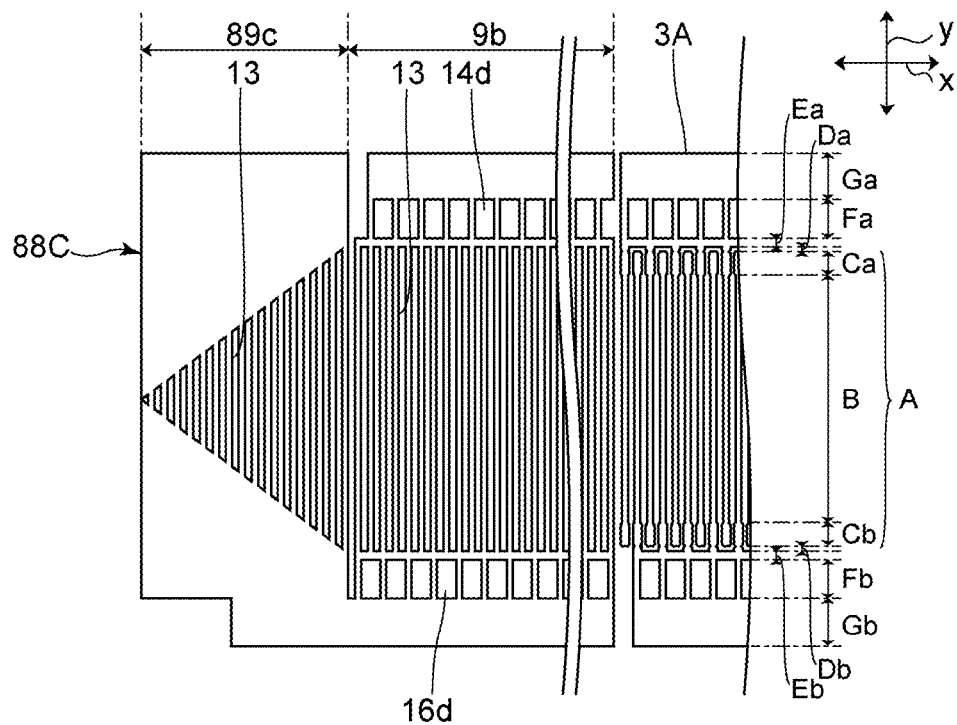
FIG. 20 is a plan view of a reflector and a part of an IDT electrode of a longitudinally coupled resonator acoustic wave filter according to a fourth preferred embodiment of the present invention.
Figure 21:
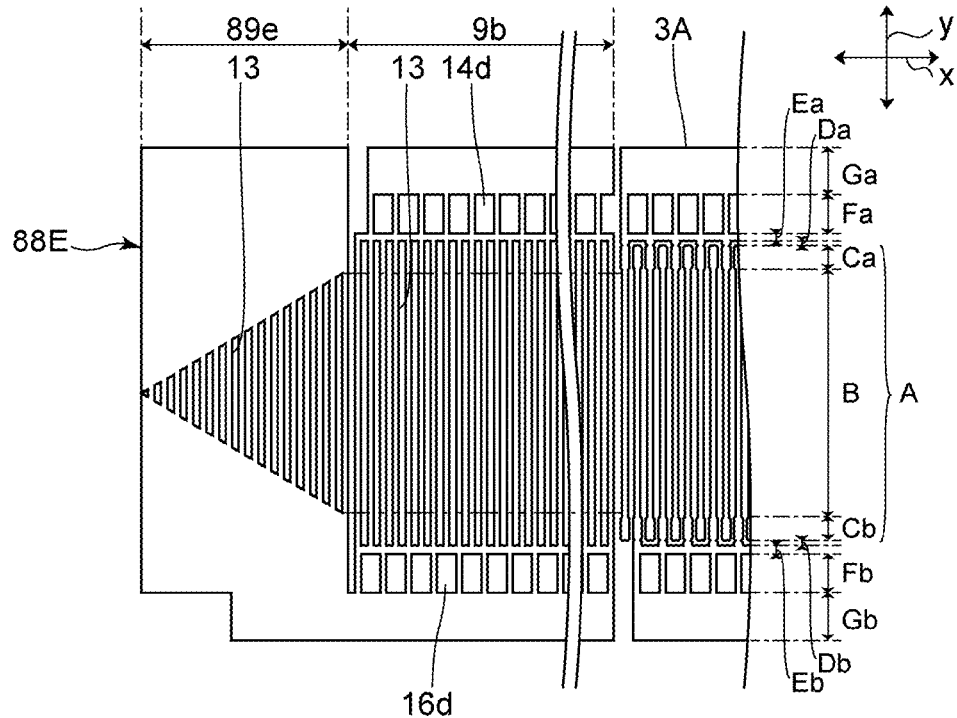
FIG. 21 is a plan view of a reflector and a part of an IDT electrode of a longitudinally coupled resonator acoustic wave filter according to a fifth preferred embodiment of the present invention.
Figure 22:
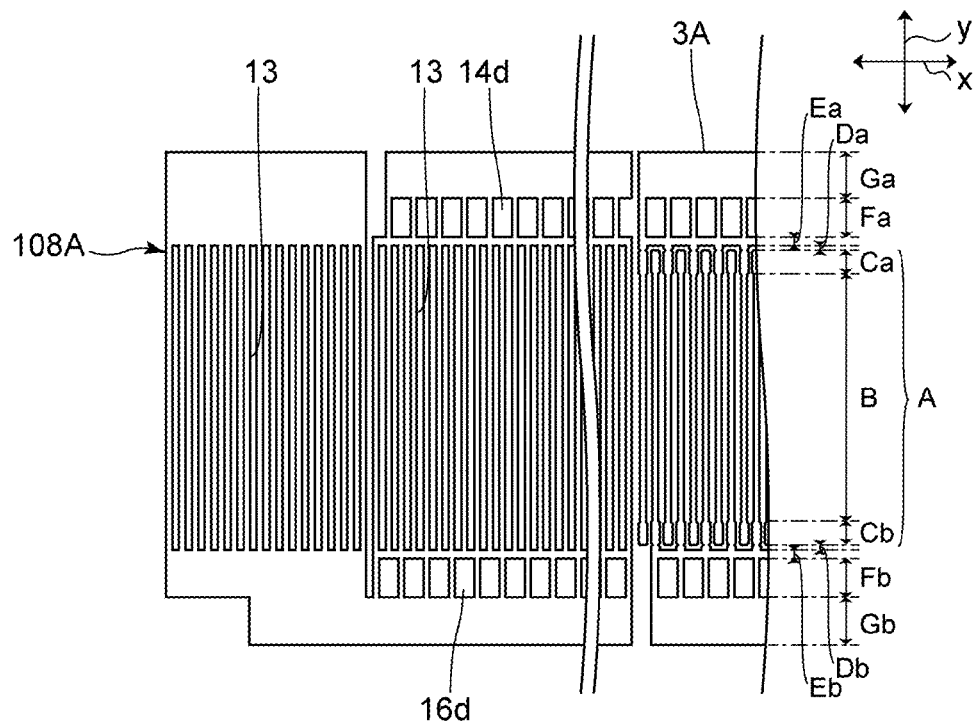
FIG. 22 is a plan view of a reflector and a part of an IDT electrode of a longitudinally coupled resonator acoustic wave filter of a comparative example.

FIG. 19 is a plan view of a reflector and a portion of an IDT electrode of a longitudinally coupled resonator acoustic wave filter according to the third preferred embodiment. FIG. 20 is a plan view of a reflector and a portion of an IDT electrode of a longitudinally coupled resonator acoustic wave filter according to the fourth preferred embodiment. FIG. 21 is a plan view of a reflector and a portion of an IDT electrode of a longitudinally coupled resonator acoustic wave filter according to the fifth preferred embodiment. FIG. 22 is a plan view of a reflector and a portion of an IDT electrode of a longitudinally coupled resonator acoustic wave filter according to the comparative example. The dashed-and-double-dotted line in FIG. 21 indicates a positional relationship between the weighted portion of the reflector and the IDT electrode.

As illustrated in FIG. 19, the present preferred embodiment is different from the first longitudinally coupled resonator acoustic wave filter 1A of the first preferred embodiment in the arrangement of the weighted portion in a reflector 88A. The present preferred embodiment is also different from the first longitudinally coupled resonator acoustic wave filter 1A in that a first reflector busbar 84 and a second reflector busbar 86 extend parallel or substantially parallel to the first direction x. Note that in a first portion 89a of the reflector 88A, a first imaginary line J4 and a second imaginary line K4 are inclined relative to the first direction x. The reflector sandwiching the plurality of IDT electrodes with the reflector 88A is configured to be in line symmetry or substantially in line symmetry with the reflector 88A relative to a symmetry axis extending in the second direction y. Other than the aspect above, the longitudinally coupled resonator acoustic wave filter of the third preferred embodiment has a configuration the same as or similar to that of the first longitudinally coupled resonator acoustic wave filter 1A.

In the present preferred embodiment, the weighted portion of the reflector 88A in the second direction y is larger than that in the first preferred embodiment.

More specifically, at least the first reflective electrode finger 13 positioned closest to the side of the IDT electrode 3A in the first portion 89a of the reflector 88A overlaps the entire or substantially the entire intersecting region A of the IDT electrode 3A when viewed in the first direction x. Further, the first reflective electrode finger 13 extends so as to overlap both of the first outer busbar region Ga and the second outer busbar region Gb. The lengths of the plurality of first reflective electrode fingers 13 decrease toward the outer side in the first direction x. As described above, the reflector 88A is weighted. Thus, the weighted portion of the reflector 88A overlaps the center region B, the first edge region Ca, the first gap region Da, the first inner busbar region Ea, the first cavity formation region Fa, and the first outer busbar region Ga. Further, the weighted portion of the reflector 88A overlaps the second edge region Cb, the second gap region Db, the second inner busbar region Eb, the second cavity formation region Fb, and the second outer busbar region Gb.

Also in the present preferred embodiment, the number of pairs of the first reflective electrode fingers increases from the outer side toward the inner side in the second direction y, and this makes it possible to disperse the response outside the stop band similarly to the first preferred embodiment. Thus, the attenuation characteristics may be made smooth in a frequency range near the lower side of the pass band, and the variations in attenuation characteristics may be reduced or prevented in the frequency range. In addition, since the longitudinally coupled resonator acoustic wave filter of the present preferred embodiment includes a piezoelectric substrate the same as or similar to the piezoelectric substrate 2 in FIG. 4, the Q factor may be increased. Similarly, in a fourth preferred embodiment and a fifth preferred embodiment of the present invention described below, the Q factor may be increased and the variations in attenuation may be reduced or prevented in a frequency range near the lower side of the pass band.

As illustrated in FIG. 20, in the fourth preferred embodiment, the weighted portion of a reflector 88C in the second direction y is narrower than that in the third preferred embodiment.

More specifically, the plurality of first reflective electrode fingers 13 in a first portion 89c of the reflector 88C overlap the center region B of the IDT electrode 3A when viewed in the first direction x. Further, at least the first reflective electrode finger 13 positioned closest to the side of the IDT electrode 3A in the first portion 89c extends so as to overlap both of the first gap region Da and the second gap region Db in the IDT electrode 3A. Whereas, none of the first reflective electrode fingers 13 overlaps the first cavity formation region Fa and the second cavity formation region Fb in the IDT electrode 3A. Thus, the weighted portion of the reflector 88C overlaps the center region B, the first edge region Ca, the first gap region Da, the second edge region Cb, and the second gap region Db when viewed in the first direction x. Whereas, the weighted portion of the reflector 88C overlaps neither the first cavity formation region Fa nor the second cavity formation region Fb.

As illustrated in FIG. 21, in the fifth preferred embodiment, the weighted portion of a reflector 88E in the second direction y is narrower than that in the fourth preferred embodiment.

More specifically, the plurality of first reflective electrode fingers 13 in a first portion 89e of the reflector 88E overlap the center region B of the IDT electrode 3A when viewed in the first direction x. Whereas, as illustrated with the dashed-and-double-dotted line in FIG. 21, none of the first reflective electrode fingers 13 overlaps the first edge region Ca and the second edge region Cb of the IDT electrode 3A. Thus, the weighted portion of the reflector 88E overlaps the center region B and does not overlap the first edge region Ca or the second edge region Cb when viewed in the first direction x.

As illustrated in FIG. 22, in the comparative example, a reflector 108A is not weighted.

Figure 23:
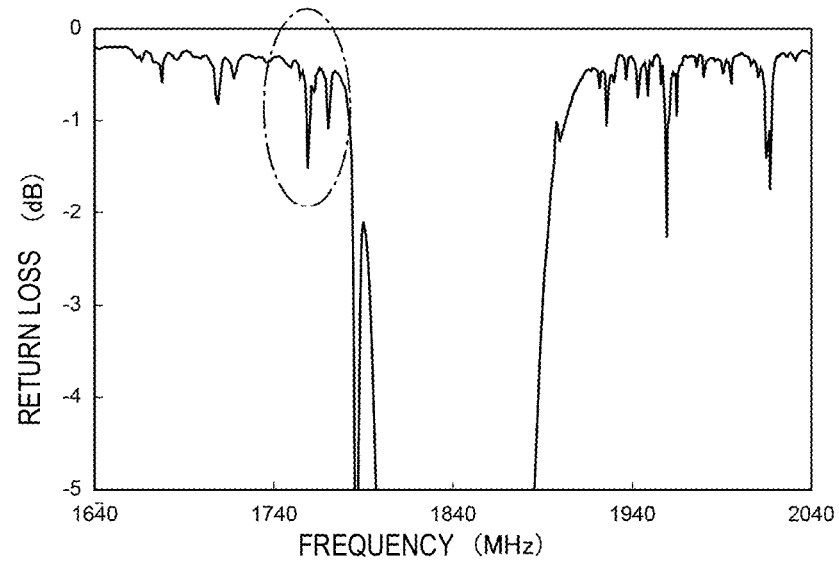
FIG. 23 is a graph of a return loss of the longitudinally coupled resonator acoustic wave filter according to the third preferred embodiment of the present invention.
Figure 24:
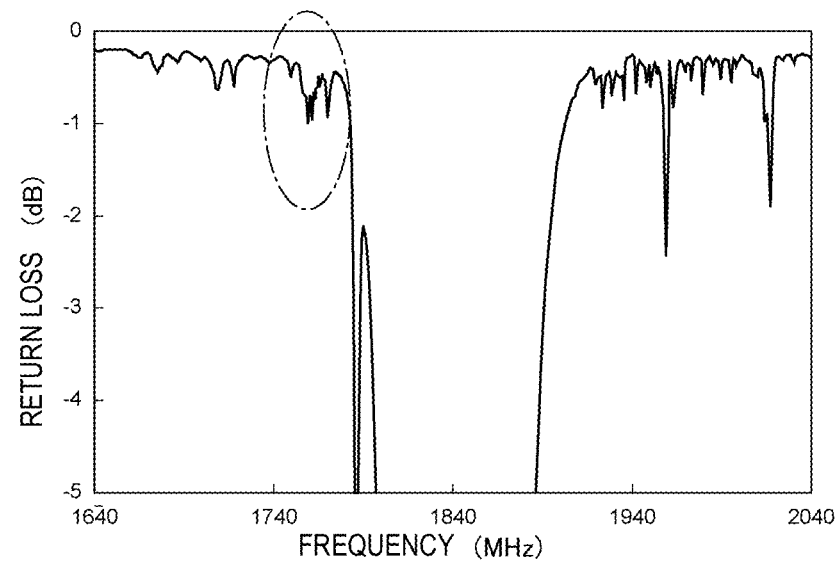
FIG. 24 is a graph of the return loss of the longitudinally coupled resonator acoustic wave filter according to the fourth preferred embodiment of the present invention.
Figure 25:
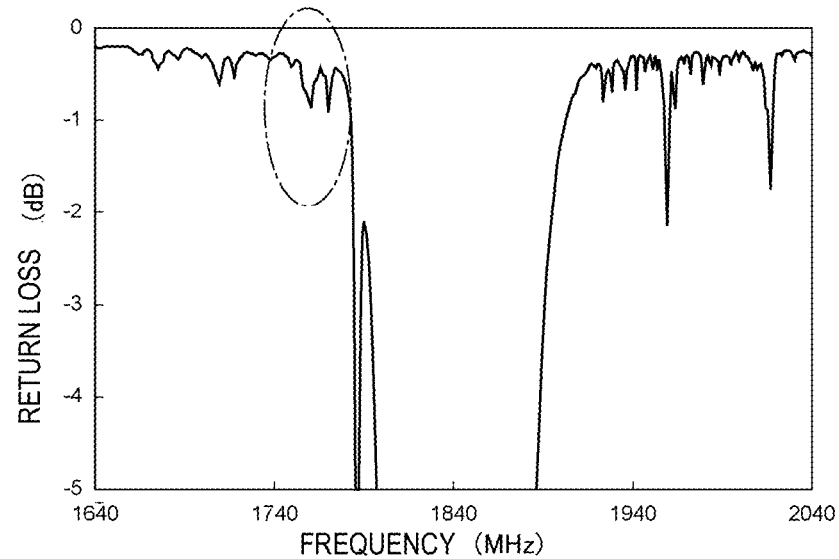
FIG. 25 is a graph of the return loss of the longitudinally coupled resonator acoustic wave filter according to the fifth preferred embodiment of the present invention.
Figure 26:
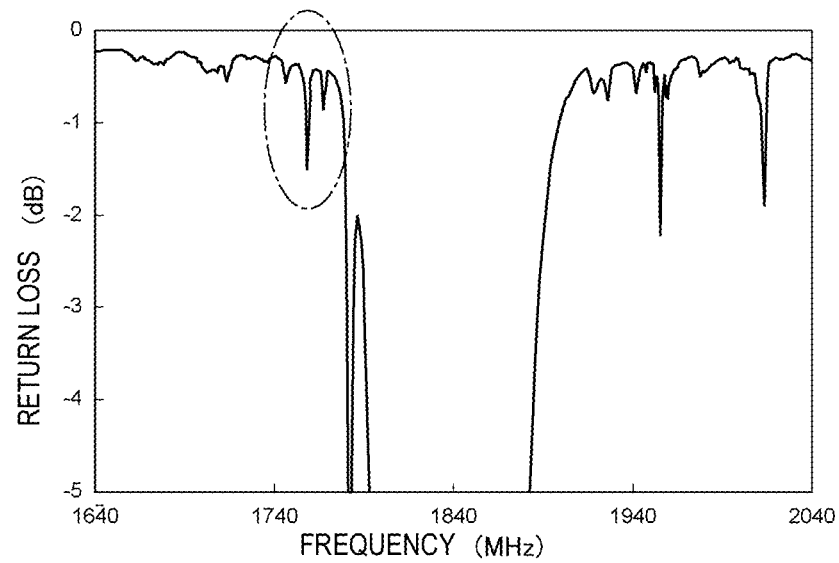
FIG. 26 is a graph of the return loss of the longitudinally coupled resonator acoustic wave filter of the comparative example.

FIG. 23 is a graph of the return loss of the longitudinally coupled resonator acoustic wave filter according to the third preferred embodiment. FIG. 24 is a graph of the return loss of the longitudinally coupled resonator acoustic wave filter according to the fourth preferred embodiment. FIG. 25 is a graph of the return loss of the longitudinally coupled resonator acoustic wave filter according to the fifth preferred embodiment. FIG. 26 is a graph of the return loss of the longitudinally coupled resonator acoustic wave filter of the comparative example.

As illustrated in FIG. 23 to FIG. 26, in each of the longitudinally coupled resonator acoustic wave filters, a ripple is generated in a frequency range indicated by a dashed-and-dotted line circle near the lower side of the pass band. Here, with respect to the longitudinally coupled resonator acoustic wave filters of which return losses are illustrated in FIG. 23 to FIG. 25, the weighted portion of the reflector in the second direction becomes narrower in the order of FIG. 23, FIG. 24, and FIG. 25. As illustrated in FIG. 23 to FIG. 25, it is seen that as the weighted portion becomes narrower, the ripple becomes smaller in a frequency range near the lower side of the pass band.

Whereas, as illustrated in FIG. 26, the ripple of the longitudinally coupled resonator acoustic wave filter of the comparative example is larger than that of the longitudinally coupled resonator acoustic wave filter of each preferred embodiment. As described above, according to preferred embodiments of the present invention, it is possible not only to reduce or prevent the variations in attenuation in a frequency range near the lower side of the pass band but also to reduce or prevent the ripples. In the third to fifth preferred embodiments, examples in which the piezoelectric substrate 2 is a laminated substrate have been described. Note that, the acoustic wave device may include the electrode configuration of any of the third to fifth preferred embodiments and the piezoelectric substrate 2 may be a piezoelectric substrate including only a piezoelectric layer. Also in this case, the ripples may be reduced or prevented. Using the longitudinally coupled resonator acoustic wave filter according to the present invention in a filter device makes it also possible to suppress the influence of ripple on another filter connected in common.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A longitudinally coupled resonator acoustic wave filter, comprising:
    a piezoelectric substrate;
    a plurality of IDT electrodes on the piezoelectric substrate and arranged along an acoustic wave propagation direction; and
    a pair of reflectors on the piezoelectric substrate on both sides of the plurality of IDT electrodes in the acoustic wave propagation direction; wherein
    each of the pair of reflectors includes a first reflector busbar and a second reflector busbar facing each other and a plurality of reflective electrode fingers connected to at least one of the first reflector busbar and the second reflector busbar;
    each of the pair of reflectors includes a first portion in which lengths of the plurality of reflective electrode fingers change in the acoustic wave propagation direction; and
    the plurality of reflective electrode fingers of each of the pair of reflectors include a first reflective electrode finger including one end connected to the first reflector busbar and another end connected to the second reflector busbar, and a second reflective electrode finger including one end connected to the first reflector busbar and another end facing the second reflector busbar with a gap therebetween.

2. The longitudinally coupled resonator acoustic wave filter according to claim 1, wherein
    each of the plurality of IDT electrodes includes a first busbar and a second busbar facing each other, a plurality of first electrode fingers each including one end connected to the first busbar, and a plurality of second electrode fingers each including one end connected to the second busbar and interdigitating with the plurality of first electrode fingers;
    a portion at which the first electrode finger and the second electrode finger overlap each other in the acoustic wave propagation direction is an intersecting region, and the intersecting region includes a center region in a central portion of the intersecting region in a direction orthogonal or substantially orthogonal to the acoustic wave propagation direction, a first edge region on a side of the center region toward the first busbar, and a second edge region on a side of the center region toward the second busbar;
    the plurality of IDT electrodes include a first gap region between the first edge region and the first busbar and a second gap region between the second edge region and the second busbar; and
    a low acoustic velocity region having an acoustic velocity lower than an acoustic velocity in the center region is included in each of the first edge region and the second edge region.

3. The longitudinally coupled resonator acoustic wave filter according to claim 2, wherein
    each of the first busbar and the second busbar of each of the plurality of IDT electrodes includes a cavity formation region in which a plurality of cavities are provided along the acoustic wave propagation direction; and
    a high acoustic velocity region having an acoustic velocity higher than an acoustic velocity in the center region is included in each of the cavity formation regions.

4. The longitudinally coupled resonator acoustic wave filter according to claim 3, wherein
    each of the first busbar and the second busbar of each of the plurality of IDT electrodes includes an outer busbar region at an outer side of each of the cavity formation regions in a direction orthogonal or substantially orthogonal to the acoustic wave propagation direction; and
    the plurality of reflective electrode fingers in the first portion of each of the pair of reflectors overlap the center region of the plurality of IDT electrodes when viewed in the acoustic wave propagation direction, at least a reflective electrode finger of the plurality of reflective electrode fingers closest to a side of the plurality of IDT electrodes in the first portion extends so as to overlap both of the cavity formation regions, and none of the plurality of reflective electrode fingers overlaps the outer busbar region when viewed in the acoustic wave propagation direction.

5. The longitudinally coupled resonator acoustic wave filter according to claim 3, wherein
    each of the first busbar and the second busbar of the plurality of IDT electrodes includes an outer busbar region at an outer side of each of the cavity formation regions in a direction orthogonal or substantially orthogonal to the acoustic wave propagation direction; and
    at least a reflective electrode finger of the plurality of reflective electrode fingers closest to a side of the plurality of IDT electrodes in the first portion of the pair of reflectors overlaps an entirety or substantially an entirety of the intersecting region of the plurality of IDT electrodes when viewed in the acoustic wave propagation direction, and the reflective electrode finger of the plurality of reflective electrode fingers extends so as to overlap both of the outer busbar regions.

6. The longitudinally coupled resonator acoustic wave filter according to claim 1, wherein
    the piezoelectric substrate includes a high acoustic velocity material layer and a piezoelectric layer directly or indirectly over the high acoustic velocity material layer; and
    an acoustic velocity of a bulk wave propagating through the high acoustic velocity material layer is higher than an acoustic velocity of an acoustic wave propagating through the piezoelectric layer.

7. The longitudinally coupled resonator acoustic wave filter according to claim 6, wherein the piezoelectric substrate further includes:
    a low acoustic velocity film between the high acoustic velocity material layer and the piezoelectric layer; and
    an acoustic velocity of a bulk wave propagating through the low acoustic velocity film is lower than an acoustic velocity of a bulk wave propagating through the piezoelectric layer.

8. The longitudinally coupled resonator acoustic wave filter according to claim 7, further comprising:
    a support substrate; wherein
    the high acoustic velocity material layer is a high acoustic velocity film between the support substrate and the low acoustic velocity film.

9. The longitudinally coupled resonator acoustic wave filter according to claim 6, wherein the high acoustic velocity material layer is a high acoustic velocity support substrate.

10. A filter device, comprising:
    the gitudinally coupled resonator acoustic wave filter according to claim 1; and
    at least one resonator other than the longitudinally coupled resonator acoustic wave filter.

11. The filter device according to claim 10, wherein the lengths of the plurality of reflective electrode fingers decrease from a side of the plurality of IDT electrodes toward an outer side in the acoustic wave propagation direction in the first portion of the respective reflector.

12. The filter device according to claim 10, wherein when an imaginary line formed by coupling end portions of the plurality of reflective electrode fingers connected to the first reflector busbar is defined as a first imaginary line, and an imaginary line formed by coupling end portions of the plurality of reflective electrode fingers connected to the second reflector busbar is defined as a second imaginary line, at least one of the first imaginary line and the second imaginary line is inclined relative to the acoustic wave propagation direction in the first portion.

13. The longitudinally coupled resonator acoustic wave filter according to claim 1, wherein each of the pair of reflectors includes a second portion in which lengths of the plurality of reflective electrode fingers are constant in the acoustic wave propagation direction.

14. The longitudinally coupled resonator acoustic wave filter according to claim 4, wherein, the second portion of the pair of reflectors is closer to a side of the plurality of IDT electrodes than is the first portion of the reflector.

15. The longitudinally coupled resonator acoustic wave filter according to claim 1, wherein the lengths of the plurality of reflective electrode fingers decrease from a side of the plurality of IDT electrodes toward an outer side in the acoustic wave propagation direction in the first portion of the respective reflector.

16. The longitudinally coupled resonator acoustic wave filter according to claim 1, wherein when an imaginary line formed by coupling end portions of the plurality of reflective electrode fingers connected to the first reflector busbar is defined as a first imaginary line, and an imaginary line formed by coupling end portions of the plurality of reflective electrode fingers connected to the second reflector busbar is defined as a second imaginary line, at least one of the first imaginary line and the second imaginary line is inclined relative to the acoustic wave propagation direction in the first portion.

17. The longitudinally coupled resonator acoustic wave filter according to claim 1, wherein the plurality of reflective electrode fingers of each of the reflector include a third reflective electrode finger including one end connected to the second reflector busbar and another end facing the first reflector busbar with a gap therebetween.

18. A longitudinally coupled resonator acoustic wave filter, comprising:
    a piezoelectric substrate;
    a plurality of IDT electrodes on the piezoelectric substrate and arranged along an acoustic wave propagation direction; and
    a pair of reflectors on the piezoelectric substrate on both sides of the plurality of IDT electrodes in the acoustic wave propagation direction; wherein
    each of the pair of reflectors includes a first reflector busbar and a second reflector busbar facing each other and a plurality of reflective electrode fingers connected to at least one of the first reflector busbar and the second reflector busbar;

each of the pair of reflectors includes a first portion in which lengths of the plurality of reflective electrode fingers change in the acoustic wave propagation direction;

each of the plurality of IDT electrodes includes a first busbar and a second busbar facing each other, a plurality of first electrode fingers each including one end connected to the first busbar, and a plurality of second electrode fingers each including one end connected to the second busbar and interdigitating with the plurality of first electrode fingers;

a portion at which the first electrode finger and the second electrode finger overlap each other in the acoustic wave propagation direction is an intersecting region, and the intersecting region includes a center region in a central portion of the intersecting region in a direction orthogonal or substantially orthogonal to the acoustic wave propagation direction, a first edge region on a side of the center region toward the first busbar, and a second edge region on a side of the center region toward the second busbar;

the plurality of IDT electrodes include a first gap region between the first edge region and the first busbar and a second gap region between the second edge region and the second busbar;

a low acoustic velocity region having an acoustic velocity lower than an acoustic velocity in the center region is included in each of the first edge region and the second edge region; and the plurality of reflective electrode fingers in the first portion of each of the pair of reflectors overlap the center region of each of the plurality of IDT electrodes and do not overlap the first edge region or the second edge region when viewed in the acoustic wave propagation direction.

19. A longitudinally coupled resonator acoustic wave filter, comprising:
a piezoelectric substrate;
a plurality of IDT electrodes on the piezoelectric substrate and arranged along an acoustic wave propagation direction; and
a pair of reflectors on the piezoelectric substrate on both sides of the plurality of IDT electrodes in the acoustic wave propagation direction; wherein
each of the pair of reflectors includes a first reflector busbar and a second reflector busbar facing each other and a plurality of reflective electrode fingers connected to at least one of the first reflector busbar and the second reflector busbar;

each of the pair of reflectors includes a first portion in which lengths of the plurality of reflective electrode fingers change in the acoustic wave propagation direction;

each of the plurality of IDT electrodes includes a first busbar and a second busbar facing each other, a plurality of first electrode fingers each including one end connected to the first busbar, and a plurality of second electrode fingers each including one end connected to the second busbar and interdigitating with the plurality of first electrode fingers;

a portion at which the first electrode finger and the second electrode finger overlap each other in the acoustic wave propagation direction is an intersecting region, and the intersecting region includes a center region in a central portion of the intersecting region in a direction orthogonal or substantially orthogonal to the acoustic wave propagation direction, a first edge region on a side of the center region toward the first busbar, and a second edge region on a side of the center region toward the second busbar;

the plurality of IDT electrodes include a first gap region between the first edge region and the first busbar and a second gap region between the second edge region and the second busbar;

a low acoustic velocity region having an acoustic velocity lower than an acoustic velocity in the center region is included in each of the first edge region and the second edge region;

each of the first busbar and the second busbar of each of the plurality of IDT electrodes includes a cavity formation region in which a plurality of cavities are provided along the acoustic wave propagation direction;

a high acoustic velocity region having an acoustic velocity higher than an acoustic velocity in the center region is included in each of the cavity formation regions; and the plurality of reflective electrode fingers in the first portion of each of the pair of reflectors overlap the center region of each of the plurality of IDT electrodes when viewed in the acoustic wave propagation direction, at least a reflective electrode finger of the plurality of reflective electrode fingers closest to a side of the plurality of IDT electrodes in the first portion extends so as to overlap both of the first gap region and the second gap region, and none of the plurality of reflective electrode fingers overlaps the cavity formation region when viewed in the acoustic wave propagation direction.

* * * * *